(12) United States Patent
Yamazaki et al.

(10) Patent No.: US 9,912,866 B2
(45) Date of Patent: Mar. 6, 2018

(54) SOLID-STATE IMAGE PICKUP APPARATUS AND METHOD OF DRIVING SOLID-STATE IMAGE PICKUP APPARATUS

(71) Applicant: CANON KABUSHIKI KAISHA, Tokyo (JP)

(72) Inventors: Kazuo Yamazaki, Yokohama (JP); Seiichirou Sakai, Yokohama (JP); Yasuhiro Oguro, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/360,873

(22) Filed: Nov. 23, 2016

(65) Prior Publication Data

US 2017/0155839 A1 Jun. 1, 2017

(30) Foreign Application Priority Data

Nov. 30, 2015 (JP) ................................. 2015-233972

(51) Int. Cl.
*H04N 5/378* (2011.01)
*H04N 5/232* (2006.01)
*H01L 27/146* (2006.01)

(52) U.S. Cl.
CPC ... *H04N 5/23245* (2013.01); *H01L 27/14614* (2013.01); *H01L 27/14636* (2013.01); *H01L 27/14643* (2013.01); *H04N 5/378* (2013.01)

(58) Field of Classification Search
CPC .............. H04N 5/23245; H04N 5/378; H01L 27/14614; H01L 27/14636; H01L 27/14643
See application file for complete search history.

(56) References Cited

U.S. PATENT DOCUMENTS

| 6,873,310 B2* | 3/2005 | Matsueda ............ G09G 3/2014 257/59 |
| 2017/0208272 A1* | 7/2017 | Guidash ............... H04N 5/3575 |
| 2017/0237917 A1* | 8/2017 | Sato ...................... H04N 5/363 348/308 |
| 2017/0280086 A1* | 9/2017 | Chao ...................... H04N 5/378 |

FOREIGN PATENT DOCUMENTS

JP 2015-039086 A 2/2015

\* cited by examiner

*Primary Examiner* — Tuan Ho
(74) *Attorney, Agent, or Firm* — Canon U.S.A., Inc. IP Division

(57) ABSTRACT

An image pickup apparatus includes a pixel array including a plurality of pixels arranged in a plurality of rows and a plurality of columns, and a plurality of column signal processing circuits provided respectively for the columns of the pixel array, each being configured to receive output signals from the pixels and an analog signal varying with time. The plurality of column signal processing circuits include a first column signal processing circuit and a second column signal processing circuit configured such that each of the first column signal processing circuit and the second column signal processing circuit is configured to be independently switched between a driving state and a power saving state. A signal line for supplying the analog signal to the first column signal processing circuit and a signal line for supplying the analog signal to the second column signal processing circuit are electrically isolated from each other.

19 Claims, 19 Drawing Sheets

SOLID-STATE IMAGE PICKUP APPARATUS AND METHOD OF DRIVING SOLID-STATE IMAGE PICKUP APPARATUS

BACKGROUND

Technical Field

The present disclosure relates to a solid-state image pickup apparatus and a method of driving a solid-state image pickup apparatus.

Description of the Related Art

Japanese Patent Laid-Open No. 2015-039086 discloses a solid-state image pickup apparatus including a pixel array in which a plurality of pixel cells are arranged in the form of a matrix, and a column AD converter configured to convert a pixel signal output from the pixel cell from an analog signal to a digital signal.

Japanese Patent Laid-Open No. 2015-039086 also discloses a technique of reducing power consumption by controlling turning-on/off columns of different pixel cells and controlling power saving for analog-to-digital converters corresponding to pixel cells using a power saving control signal.

SUMMARY

In an aspect of the present disclosure, a solid-state image pickup apparatus includes a pixel array including a plurality of pixels arranged in a plurality of rows and a plurality of columns, and a plurality of column signal processing circuits provided respectively for the columns of the pixel array, each being configured to receive output signals from the pixels and an analog signal varying with time. The plurality of column signal processing circuits include a first column signal processing circuit and a second column signal processing circuit configured such that each of the first column signal processing circuit and the second column signal processing circuit is configured to be independently switched between a driving state and a power saving state. A signal line for supplying the analog signal to the first column signal processing circuit and a signal line for supplying the analog signal to the second column signal processing circuit are electrically isolated from each other.

In another aspect of the present disclosure, a solid-state image pickup apparatus includes a pixel array including a plurality of pixels arranged in a plurality of rows and a plurality of columns, a plurality of column signal processing circuits provided respectively for the columns of the pixel array, each column signal processing circuit including an amplifier circuit configured to amplify an output signal from at least one of the plurality of pixels and a clipping circuit configured to clip an output voltage of the amplifier circuit, and a clip voltage signal line for supplying a clip voltage to the clipping circuit of the column signal processing circuits. The plurality of column signal processing circuits include a first column signal processing circuit and a second column signal processing circuit configured such that each of the first column signal processing circuit and the second column signal processing circuit is configured to be independently switched between a driving state and a power saving state. The clipping circuit performs a clipping operation on the output voltage only when the column signal processing circuit is in the driving state.

In another aspect, the present disclosure provides a method of driving a solid-state image pickup apparatus, the solid-state image pickup apparatus including a pixel array including a plurality of pixels arranged in a plurality of rows and a plurality of columns, and a plurality of column signal processing circuits provided respectively for the columns of the pixel array, each being configured to receive output signals from the pixels and an analog signal varying with time. The method includes setting a first part of the column signal processing circuits to be in a driving state and setting a second part of the column signal processing circuits to be in a power saving state, and supplying the analog signal to the first part of the column signal processing circuits via a first signal line and supplying the analog signal to the second part of the column signal processing circuits via a second signal line electrically isolated from the first signal line.

In another aspect, the present disclosure provides a method of driving a solid-state image pickup apparatus, the solid-state image pickup apparatus including a pixel array including a plurality of pixels arranged in a plurality of rows and a plurality of columns, and a plurality of column signal processing circuits provided respectively for the columns of the pixel array, each column signal processing circuit including an amplifier circuit configured to amplify an output signal from a pixel and a clipping circuit configured to clip an output voltage of the amplifier circuit. The method includes setting a first part of the column signal processing circuits to be in a driving state and setting a second part of the column signal processing circuits to be in a power saving state, and setting the clipping circuit of the first part of the column signal processing circuits to be in a driving state and setting the clipping circuit of the second part of the column signal processing circuits to be in a non-operating state.

Further features of the present invention will become apparent from the following description of exemplary embodiments with reference to the attached drawings.

DESCRIPTION OF THE EMBODIMENTS

According to some embodiments, it is possible to effectively reduce crosstalk between a column signal processing circuit which is not in the power saving state and a column signal processing circuit which is in the power saving state thereby making it possible to acquire a high-resolution image.

It is found that, when column signal processing circuits of part of columns are set to be in the power saving state, crosstalk may occur between a column signal processing circuit which is not in the power saving state and a column signal processing circuit which is in the power saving state. This may result in degradation in image quality. A technique is provided to reduce crosstalk between a column signal processing circuit which is not in the power saving state and a column signal processing circuit which is in the power saving state, and thereby making it possible to realize a solid-state image pickup apparatus capable of acquiring a high-resolution image.

According to some embodiments, a solid-state image pickup apparatus is provided which is capable of reducing crosstalk between a column signal processing circuit not in a power saving state and a column signal processing circuit in a power saving state thereby making it possible to acquire a high-resolution image. According to some embodiments, a method of driving a solid-state image pickup apparatus is provided.

First Embodiment

Figure 1:
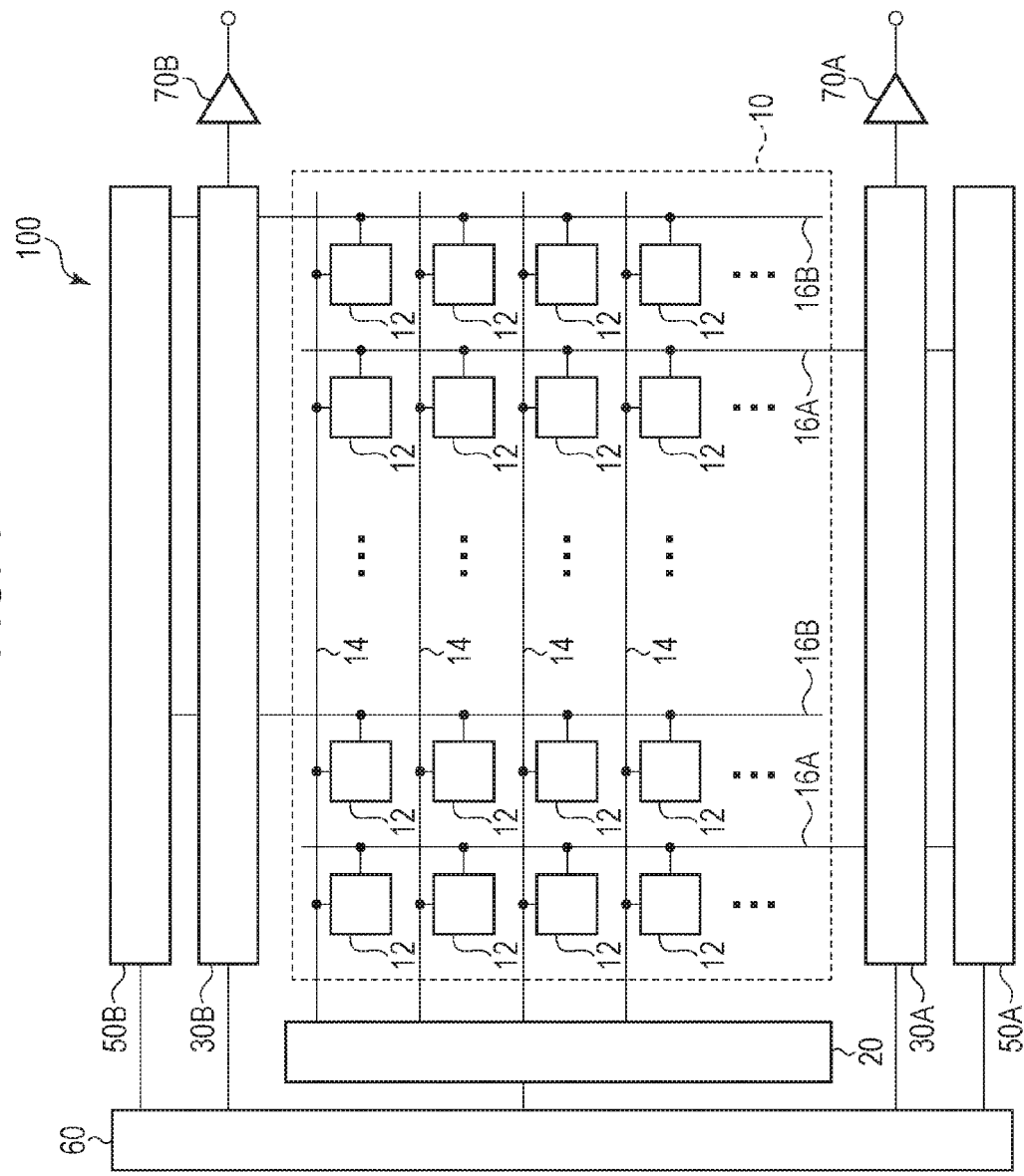
FIG. 1 is a block diagram illustrating an example of a configuration of a solid-state image pickup apparatus according to a first embodiment.
Figure 2:
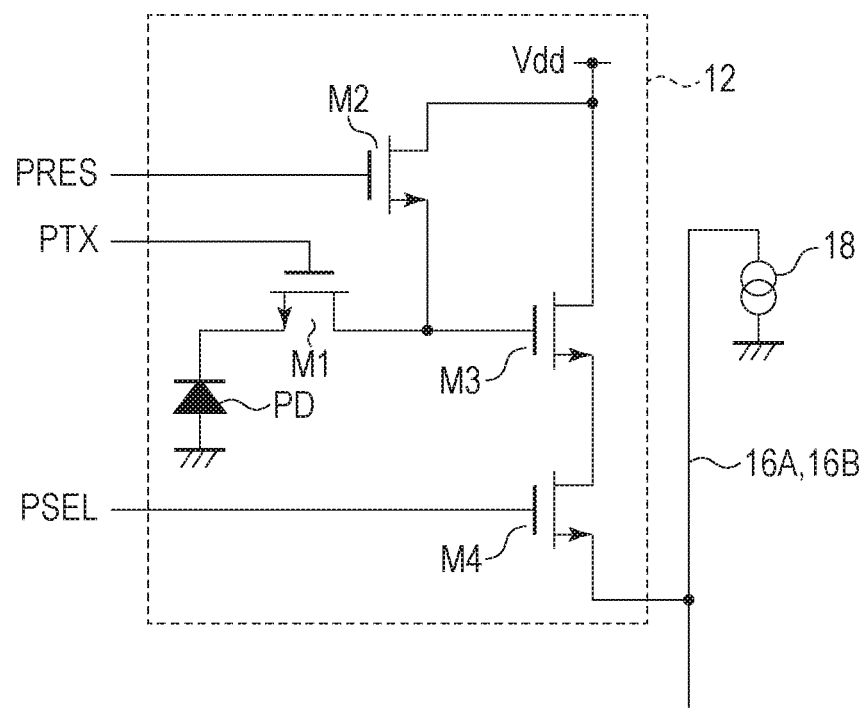
FIG. 2 is a circuit diagram illustrating a circuit configuration of a pixel of the solid-state image pickup apparatus according to the first embodiment.
Figure 3:
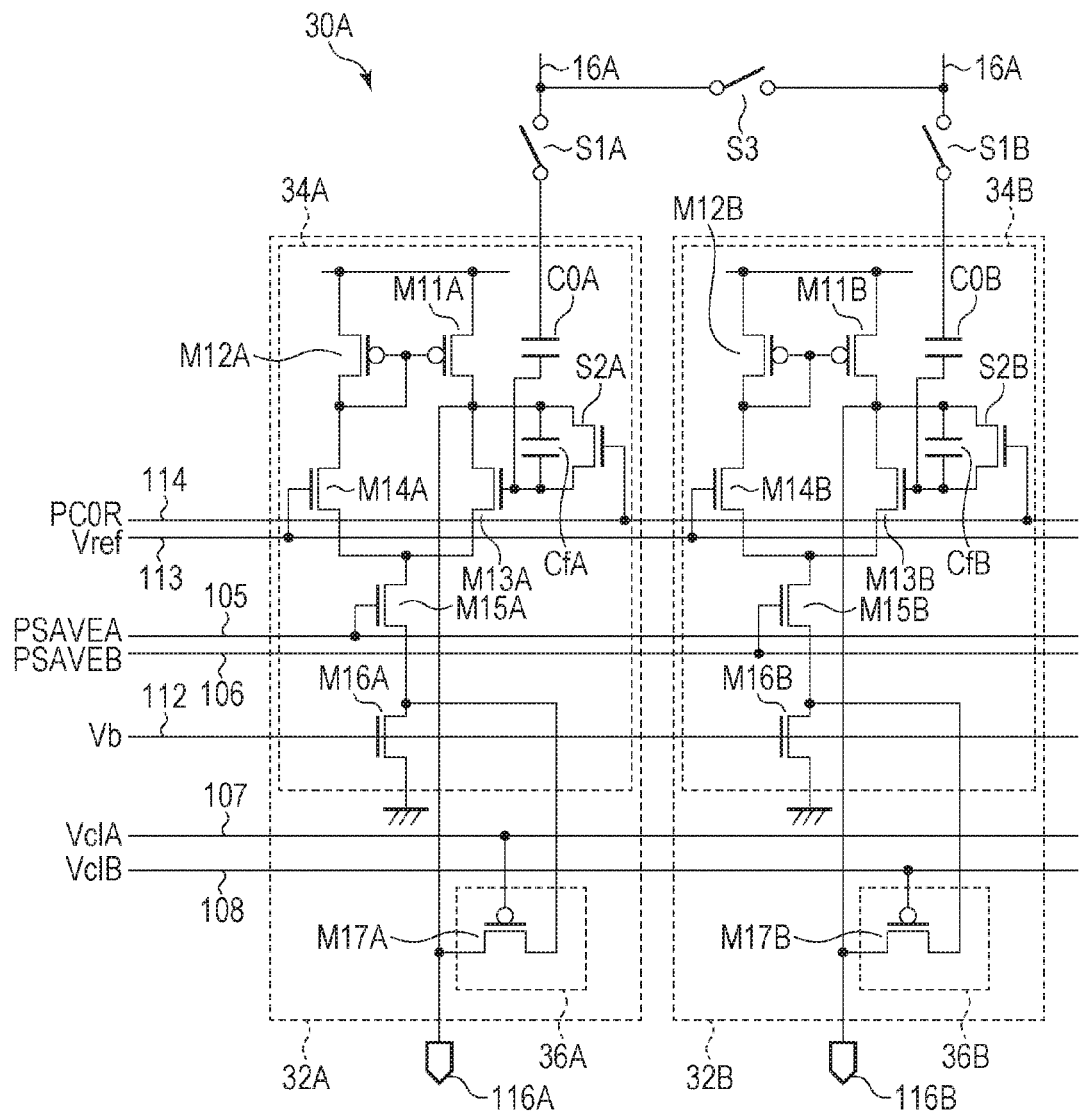
FIG. 3 is a circuit diagram illustrating a circuit configuration of a column reading circuit of the solid-state image pickup apparatus according to the first embodiment.
Figure 4:
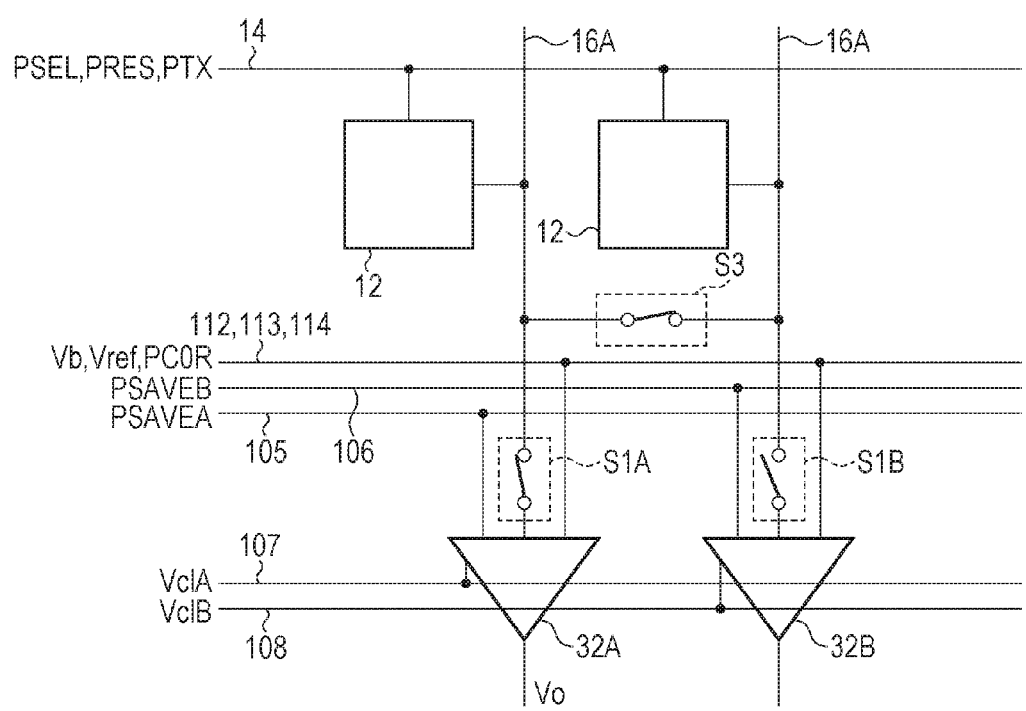
FIG. 4 is a circuit diagram illustrating a method of driving the solid-state image pickup apparatus according to the first embodiment.
Figure 5:
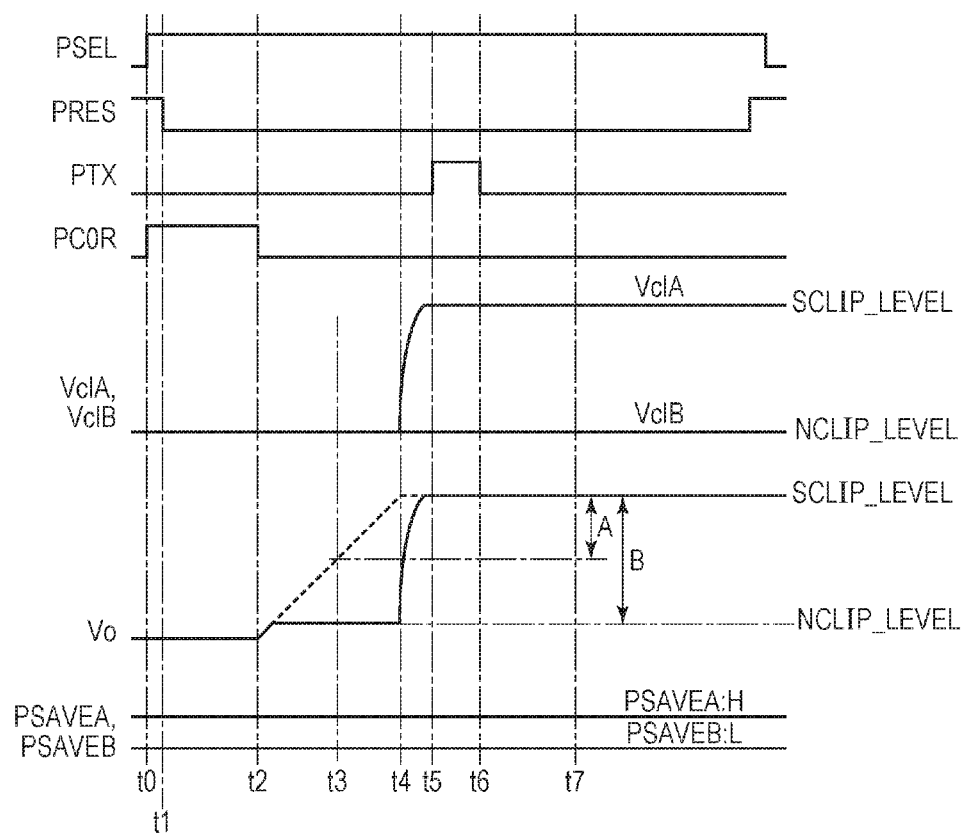
FIG. 5 is a timing chart (first one) illustrating a first method of driving the solid-state image pickup apparatus according to the first embodiment.
Figure 6:
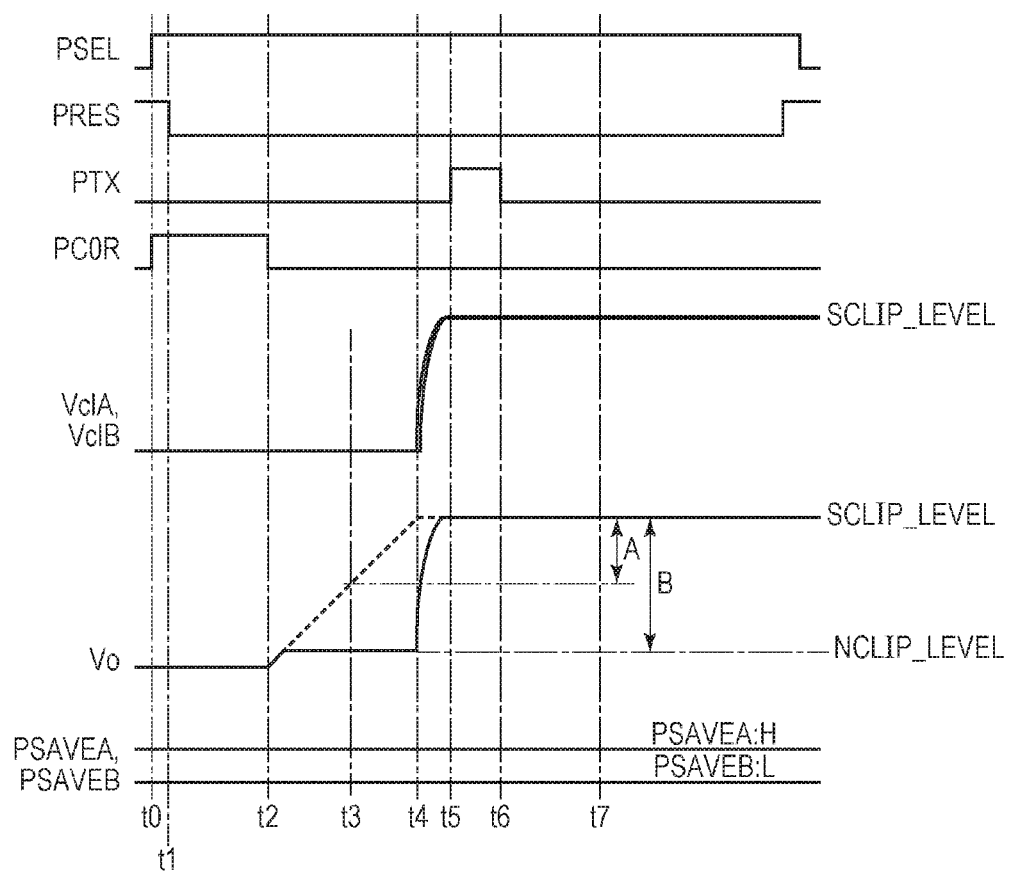
FIG. 6 is a timing chart (second one) illustrating a second method of driving the solid-state image pickup apparatus according to the first embodiment.

A solid-state image pickup apparatus and a method of driving it according to a first embodiment are described below with reference to FIG. 1 to FIG. 6. FIG. 1 is a block diagram illustrating an example of a configuration of the solid-state image pickup apparatus according to the present embodiment. FIG. 2 is a circuit diagram illustrating a circuit configuration of a pixel of the solid-state image pickup apparatus according to the present embodiment. FIG. 3 is a circuit diagram illustrating an example of a configuration of a column reading circuit of the solid-state image pickup apparatus according to the present embodiment. FIG. 4 is a circuit diagram illustrating a method of driving the solid-state image pickup apparatus according to the present embodiment. FIG. 5 and FIG. 6 are timing charts illustrating a method of driving the solid-state image pickup apparatus according to the present embodiment.

First, the structure of the solid-state image pickup apparatus according to the present embodiment is described below with reference to FIG. 1 to FIG. 3.

The solid-state image pickup apparatus 100 according to the present embodiment includes, as shown in FIG. 1, a pixel array 10, a vertical scanning circuit 20, column reading circuits 30A and 30B, horizontal scanning circuits 50A and 50B, a control circuit 60, and output circuits 70A and 70B.

The pixel array 10 includes a plurality of pixels 12 arranged in the form of a matrix along a plurality of rows and a plurality of columns. Drive signal lines 14 are disposed in respective rows such that each drive signal line 14 extends in a row direction (in a horizontal direction in the figure). Each drive signal line 14 functions as a signal line used in common by all pixels 12 located in a corresponding row. The drive signal lines 14 are connected to the vertical scanning circuit 20. The vertical scanning circuit 20 supplies a control signal to a reading circuit (not shown) in the pixel 12 when a signal is read out from the pixel 12.

In each column of the pixel array 10, a vertical signal line 16A or a vertical signal line 16B is disposed so as to extend in a column direction (in a vertical direction in the figure). In the example shown in FIG. 1, signal lines are disposed in columns such that vertical signal lines 16A and vertical signal lines 16B are disposed alternately. The vertical signal lines 16A and 16B each function as a signal line used in common by pixels 12 disposed in a corresponding column. The plurality of pixels 12 in the pixel array 10 are grouped, in each column, into those connected to the vertical signal line 16A and those connected to the vertical signal line 16B.

One end of the vertical signal line 16A is connected to the column reading circuit 30A. The column reading circuit 30A is connected to the horizontal scanning circuit 50A. One end of the vertical signal line 16B is connected to the column reading circuit 30B. The column reading circuit 30B is connected to the horizontal scanning circuit 50B. The column reading circuits 30A and 30B are circuit units configured to perform signal processing such as an amplification process, and also an analog-to-digital conversion process if necessary, on the signal read out from the pixels 12. The horizontal scanning circuits 50A and 50B are for sequentially transferring the signals respectively processed by the column reading circuits 30A and 30B to the output circuits 70A and 70B. The column reading circuit 30A and the horizontal scanning circuit 50A are disposed on a side opposing, in the column direction via the pixel array 10, a side where the column reading circuit 30B and the horizontal scanning circuit 50B are disposed.

Figure 19:
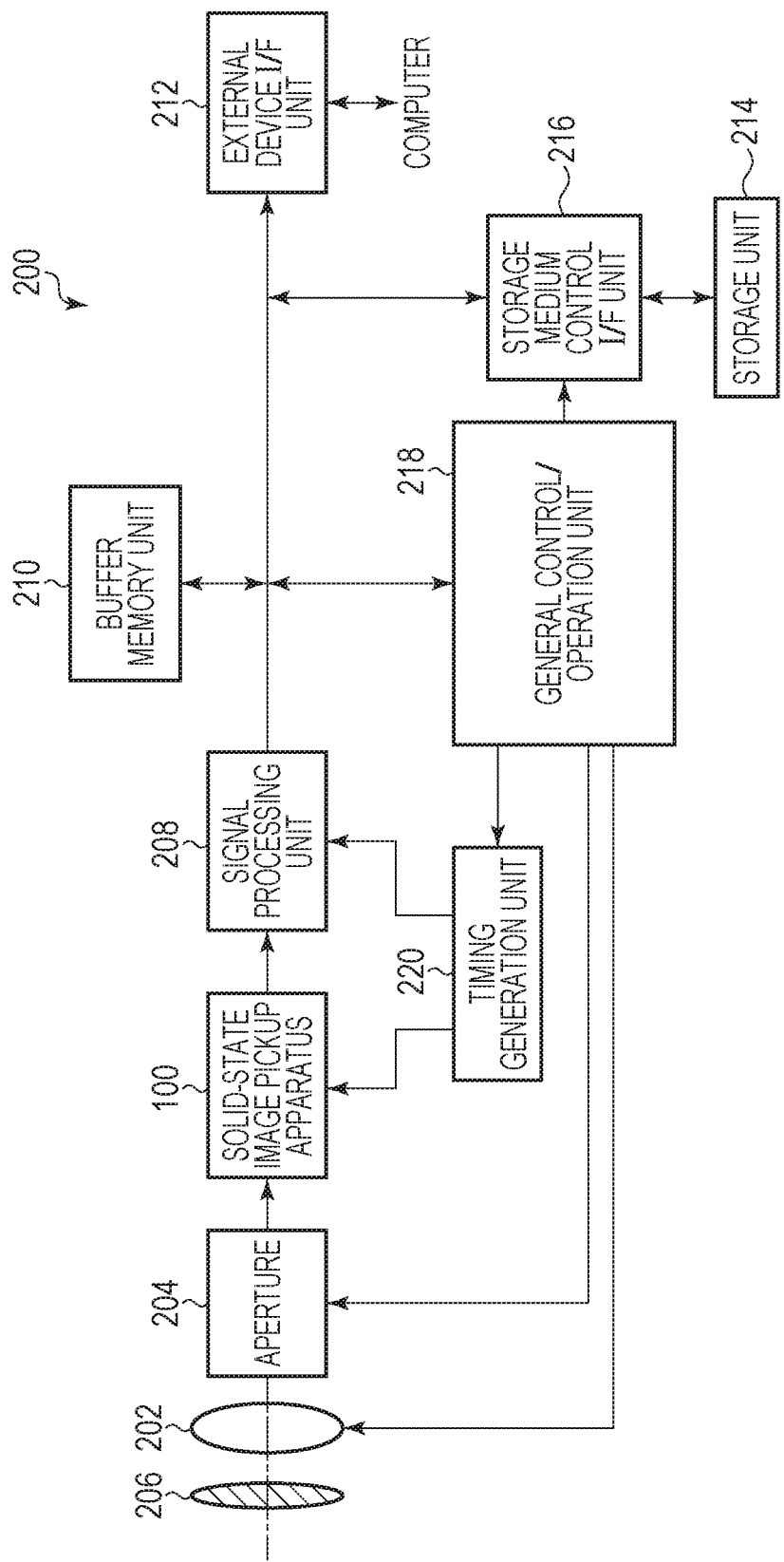
FIG. 19 is a block diagram illustrating an example of a configuration of an image pickup system according to a sixth embodiment.

The control circuit 60 is for supplying signals to the vertical scanning circuit 20, the column reading circuits 30A and 30B and the horizontal scanning circuits 50A and 50B thereby to control operations and operation timings thereof. Note that the function of the control circuit 60 may be provided by a signal processing unit (for example, a general control/operation unit 218 and a timing generator 220 of an image pickup system according to a sixth embodiment as shown in FIG. 19 described below) located outside the solid-state image pickup apparatus 100. The output circuits 70A and 70B are circuits configured to output, to the outside, the signals output from the column reading circuits 30A and 30B.

In the example shown in FIG. 1, each of the column reading circuit 30 and the horizontal scanning circuit 50 is divided into two groups, and the two groups are disposed at locations opposing each other via the pixel array 10. However, dividing into two groups is not necessarily needed, and the column reading circuit 30 and the horizontal scanning circuit 50 may be disposed on one side of the pixel array 10.

Each pixel 12 includes, as shown in FIG. 2, a photodiode PD, a transfer transistor M1, a reset transistor M2, an amplification transistor M3, and a selection transistor M4. An anode of the photodiode PD is connected to a reference voltage line. A cathode of the photodiode PD is connected to a source of the transfer transistor M1. A drain of the transfer transistor M1 is connected to a source of the reset transistor M2 and a gate of the amplification transistor M3. A floating diffusion part (hereafter referred to as an "FD part") is formed by a connection node at which the drain of the transfer transistor M1, the source of the reset transistor M2, and the gate of the amplification transistor M3 are connected together. A drain of the reset transistor M2 and a drain of the amplification transistor M3 are connected to a power supply voltage line (Vdd). A source of the amplification transistor M3 is connected to a drain of the selection transistor M4. A source of the selection transistor M4 is connected to the vertical signal line 16A or the vertical signal line 16B. The vertical signal lines 16A and 16B are connected to a current source 18.

The photodiode PD is a photoelectric conversion unit configured to generate, by a photoelectric conversion, a charge based on incident light and store the resultant charge. The transfer transistor M1 is a switch for controlling transferring of the charge from the photodiode PD to the FD part. The transfer transistor M1 is driven by a control signal PTX input to the gate thereof such that the transfer transistor M1 is in an ON-state when the control signal PTX is at a high level (H-level). The FD part is capable of holding the charge transferred from the photodiode PD. The reset transistor M2 is a switch for controlling a reset operation of resetting the potential of the FD part to a reset voltage depending on the power supply voltage Vdd. The reset transistor M2 is driven by a control signal PRES input to the gate thereof such that the reset transistor M2 is in the ON-state when the control signal PRES is at the H-level. The amplification transistor M3 is for amplifying a signal based on the signal charge held in the FD part and outputting the resultant amplified signal. The amplification transistor M3 receives the power supply voltage Vdd at its drain and receives, at its source, a bias current supplied from the current source 18 via the selection transistor M4 and the vertical signal line 16A or 16B thereby forming a source follower circuit. The selection transistor M4 is a switch for controlling outputting of a signal from the amplification transistor M3 to the vertical signal line 16A or 16B. The selection transistor M4 is driven by a control signal PSEL input to the gate thereof such that the selection transistor M4 is in the ON-state when the control signal PSEL is at the H-level.

Note that the drive signal line 14 disposed in each row of the pixel array 10 includes a drive signal line for supplying the control signal PTX, a signal line for supplying the control signal PRES, and a signal line for supplying the control signal PSEL. The control signals PTX, PRES, and PSEL are supplied to the pixel 12 from the vertical scanning circuit 20 via the drive signal line 14.

The column reading circuits 30A and 30B each include a plurality of column signal processing circuits 32. The plurality of column signal processing circuits 32 are disposed such that each column of the pixel array 10 has one column signal processing circuit 32. Note that the number of column signal processing circuits 32 disposed for each column of the pixel array 10 is not limited to one, but the number of column signal processing circuits 32 may be properly selected depending on the number of vertical signal lines 16 provided for each column of the pixel array 10 or other factors.

FIG. 3 illustrates an example of a circuit configuration of two column signal processing circuits 32 located adjacent to each other. Although in the following description, by way of example, the column signal processing circuits 32 of the column reading circuit 30A are explained, the column signal processing circuits 32 of the column reading circuit 30B are similar to those of the column reading circuit 30A.

The column reading circuit 30A includes two different column signal processing circuits 32A and 32B. FIG. 3 shows the column signal processing circuit 32A and the column signal processing circuit 32B disposed adjacent to each other.

The column signal processing circuit 32A includes an amplifier circuit 34A and a clipping circuit 36A. The column signal processing circuit 32A may further includes other circuits such as an analog-to-digital converter, a sample-and-hold circuit, and/or the like. The amplifier circuit 34A includes P-type MOS transistors M11A and M12A, and N-type MOS transistors M13A, M14A, M15A, and M16A thereby forming a differential amplifier circuit. The N-type MOS transistors M15A and M16A each function as a current source circuit, and the N-type MOS transistor M15A functions as a switch that controls turning-on/off of the current. That is, the N-type MOS transistor M15A functions as a switch that changes the state of the amplifier circuit 34A between the driving state and the power saving state.

Drains of the P-type MOS transistors M11A and M12A are connected to a power supply voltage line. A source of the P-type MOS transistor M11A is connected to a drain of the N-type MOS transistor M13A. A source of the P-type MOS transistor M12A is connected to a drain of the N-type MOS transistor M14A. Gates of the P-type MOS transistors M11A and M12A are connected to a connection node between the source of the P-type MOS transistor M12A and the drain of the N-type MOS transistor M14A. Sources of the N-type MOS transistors M13A and M14A are connected to a drain of the N-type MOS transistor M15A. A source of the N-type MOS transistor M15A is connected to a drain of the N-type MOS transistor M16A. A source of the N-type MOS transistor M16A is connected to a reference voltage line. A gate of the N-type MOS transistor M13A functions as an inverting input node of the differential amplifier circuit, and a gate of the N-type MOS transistor M14A functions as a non-inverting input node of the differential amplifier circuit. An output node of the differential amplifier circuit is given by a connection node between the source of the P-type MOS transistor M11A and the drain of the N-type MOS transistor M13A.

The inverting input node of the differential amplifier circuit in the column signal processing circuit 32A is connected to the vertical signal line 16A via a capacitor C0A and a switch S1A. A capacitor CfA and a switch S2A are connected in parallel between the inverting input node and the output node of the differential amplifier circuit in the column signal processing circuit 32A.

The clipping circuit 36A includes a P-type MOS transistor M17A. A source of the P-type MOS transistor M17A is connected to the output node of the differential amplifier circuit. A drain of the P-type MOS transistor M17A is connected to a connection node between the source of the N-type MOS transistor M15A and the drain of the N-type MOS transistor M16A. Note that the drain of P-type MOS transistor M17A may be connected to another voltage terminal such as a ground voltage line or the like as long as the clipping circuit 36A performs a clipping operation.

Similarly, the column signal processing circuit 32B includes an amplifier circuit 34B and a clipping circuit 36B. The column signal processing circuit 32B may further include an analog-to-digital converter, a sample-and-hold circuit, and/or the like. The amplifier circuit 34B includes P-type MOS transistors M11B and M12B and N-type MOS transistors M13B, M14B, M15B, and M16B thereby forming a differential amplifier circuit. The N-type MOS transistors M15B and M16B each function as a current source circuit, and the N-type MOS transistor M15B functions as a switch that controls turning-on/off of the current. That is, the N-type MOS transistor M15B functions as a switch that changes the state of the amplifier circuit 34B between the driving state and the power saving state.

Drains of the P-type MOS transistors M11B and M12B are connected to the power supply voltage line. A source of the P-type MOS transistor M11B is connected to a drain of the N-type MOS transistor M13B. A source of the P-type MOS transistor M12B is connected to a drain of the N-type MOS transistor M14B. Gates of the P-type MOS transistors M11B and M12B are connected to a connection node between the source of the P-type MOS transistor M12B and the drain of the N-type MOS transistor M 14B. Sources of the N-type MOS transistors M13B and M14B are connected to a drain of the N-type MOS transistor M15B. A source of the N-type MOS transistor M15B is connected to a drain of the N-type MOS transistor M16B. A source of the N-type MOS transistor M16B is connected to a reference voltage line. A gate of the N-type MOS transistor M13B functions as an inverting input node of the differential amplifier circuit, and a gate of the N-type MOS transistor M14B functions as a non-inverting input node of the differential amplifier circuit. An output node of the differential amplifier circuit is given by a connection node between the source of the P-type MOS transistor M11B and the drain of the N-type MOS transistor M13B.

The inverting input node of the differential amplifier circuit in the column signal processing circuit 32B is connected to the vertical signal line 16A via a capacitor COB and a switch S1B. A capacitor CfB and a switch S2B are connected in parallel between the inverting input node and the output node of the differential amplifier circuit in the column signal processing circuit 32B.

The clipping circuit 36B includes a P-type MOS transistor M17B. A source of the P-type MOS transistor M17B is connected to the output node of the differential amplifier circuit. A drain of the P-type MOS transistor M17B is connected to a connection node between the source of the N-type MOS transistor M15B and the drain of the N-type MOS transistor M16B. Note that the drain of P-type MOS transistor M17B may be connected to another voltage terminal such as a ground voltage line or the like as long as the clipping circuit 36B performs a clipping operation.

The column reading circuit 30A includes signal lines extending in the row direction. More specifically, the signal lines are power saving control signal lines 105 and 106, clip voltage signal lines 107 and 108, a bias voltage signal line 112, a reference voltage signal line 113, and a clamp control signal line 114. The power saving control signal line 105 is connected to the gate of the N-type MOS transistor M15A in the column signal processing circuit 32A. The power saving control signal line 106 is connected to the gate of the N-type MOS transistor M15B in the column signal processing circuit 32B. The clip voltage signal line 107 is connected to the gate of the P-type MOS transistor M17A in the column signal processing circuit 32A. The clip voltage signal line 108 is connected to the gate of the P-type MOS transistor M17B in the column signal processing circuit 32B. The bias voltage signal line 112 is connected to the gate of the N-type MOS transistor M16A in the column signal processing circuit 32A and the gate of the N-type MOS transistor M16B in the column signal processing circuit 32B. The reference voltage signal line 113 is connected to the non-inverting input node of the differential amplifier circuit in the column signal processing circuit 32A and the non-inverting input node of the differential amplifier circuit in the column signal processing circuit 32B. The clamp control signal line 114 is connected to a control node of the switch S2A in the column signal processing circuit 32A and a control node of the switch S2B in the column signal processing circuit 32B. Between adjacent vertical signal lines 16A, there is disposed a switch S3 for switching the state of the connection between the adjacent vertical signal lines 16A.

Voltages or control signals are independently supplied from the control circuit 60 to the power saving control signal lines 105 and 106, the clip voltage signal lines 107 and 108, the bias voltage signal line 112, the reference voltage signal line 113, and the clamp control signal line 114. Control signals are supplied from the control circuit 60 to control nodes of the switches S1A, S1B, S2A, S2B, and S3.

In the solid-state image pickup apparatus 100 according to the present embodiment, as described above, the power saving control signal line 105 connected to the column signal processing circuit 32A is realized using a signal line different from a signal line forming the power saving control signal line 106 connected to the column signal processing circuit 32B. Furthermore, the clip voltage signal line 107 connected to the column signal processing circuit 32A is realized using a signal line different from a signal line forming the clip voltage signal line 108 connected to the column signal processing circuit 32B.

The above-described configuration makes it possible to independently drive the column signal processing circuits 32A and 32B according to the control signals supplied to the power saving control signal lines 105 and 106. That is, for example, in a case where the control signals supplied to the power saving control signal lines 105 and 106 are both at the H-level, the column signal processing circuits 32A and 32B are both in the driving state. On the other hand, in a case where the control signal supplied to the power saving control signal line 105 is at the H-level, and the control signal supplied to the power saving control signal line 106 is at a low level (L-level), the column signal processing circuit 32A is in the driving state and the column signal processing circuit 32B is in the power saving state. In a case where the control signal supplied to the power saving control signal line 105 is at the L-level, and the control signal supplied to the power saving control signal line 106 is at the H-level, and the column signal processing circuit 32A is in the power saving state, and the column signal processing circuit 32B is in the driving state. In the present description, the driving state is a state in which the N-type MOS transistors M15A and M15B are both in the ON-state and the differential amplifier circuit is in operation. The power saving state is a low power consumption state in which the N-type MOS transistors M15A and M15B are both in the OFF-state and the differential amplifier circuit is not in operation. Alternatively, the power saving state may be a state in which the operation is performed with lower power consumption than in the normal operation. The driving state may be said to be a state in which when consumption power in the power saving state is denoted by first consumption power, consumption power in the driving state is second consumption power greater than the first consumption power.

By controlling the column signal processing circuits 32A and 32B such that one of them is in the driving state and the other one is in the power saving state, it is possible to prevent crosstalk from occurring through the clip voltage signal line. The crosstalk through the clip voltage signal line will be described in further detail below for a case, by way of example, in which the column signal processing circuits 32A and 32B operate with the common clip voltage signal line, and the column signal processing circuit 32A and the column signal processing circuit 32B are respectively in the driving state and the power saving state.

The output signal from the output signal line 116A of the column signal processing circuit 32A and the output signal from the output signal line 116B of the column signal processing circuit 32B change depending on optical signals from pixels 12 respectively connected thereto. However, in the case where the column signal processing circuit 32B is in the power saving state, the column signal processing circuit 32B is disconnected from any pixel 12, and thus the change in the output signal from the column signal processing circuit 32B is greatly different from that in the output signal from the column signal processing circuit 32A. In the case where the column signal processing circuits 32A and 32B operate with the common clip voltage signal line, the gate of the P-type MOS transistor M17A and the gate of the P-type MOS transistor M17B are connected to each other via the clip voltage signal line. Therefore, the change in the signal level of the output signal from the column signal processing circuit 32B may exert an influence via the P-type MOS transistor M17B on the signal level at the signal output terminal of the column signal processing circuit 32A, which may influence image quality.

In this regard, according to the present embodiment, the solid-state image pickup apparatus 100 is configured such that the clip voltage signal line 107 connected to the column signal processing circuit 32A and the clip voltage signal line 108 connected to the column signal processing circuit 32B are provided by different signal lines. Therefore, even in the case where the column signal processing circuit 32B is in the power saving state, it is possible to reduce the influence of the column signal processing circuit 32B on the output signal of the column signal processing circuit 32A, which results in a reduction in degradation in image quality.

Next, a method of driving the solid-state image pickup apparatus according to the present embodiment is described below with reference to FIG. 4 to FIG. 6. In the following description, as an example of an operation mode in which the column signal processing circuit 32A is in the driving state and the column signal processing circuit 32B is in the power saving state, an explanation is given for a case where reading is performed in a connection state shown in FIG. 4. The operation mode shown in FIG. 4 is a mode in which pixel signals output from two pixels 12 respectively connected to vertical signal lines 16A in different columns are superimposed on each other, and a resultant signal superimposed signal is read out via one column signal processing circuit 32A. In a case where the pixel signal output from each pixel 12 is a voltage signal, the signal output from the column signal processing circuit 32A is a signal given by an arithmetic mean of pixel signals output from two pixels 12. In this operation mode, as shown in FIG. 4, the switch S1A and the switch S3 are turned on while the switch S1B is turned off. Note that in the case of the normal operation mode in which the pixel signals from the respective pixel 12 in each column are read by the column signal processing circuit 32 corresponding to the column, the switches S1A and S1B are turned on and the switch S3 is turned off.

FIG. 5 is a timing chart illustrating a method of driving the solid-state image pickup apparatus according to the present embodiment. In FIG. 5, a control signal POOR is a control signal supplied from the control circuit 60 to the clamp control signal line 114. A voltage VclA is a clip voltage supplied from the control circuit 60 to the clip voltage signal line 107. A voltage Vc1B is a clip voltage supplied from the control circuit 60 to the clip voltage signal line 108. A voltage Vo is an output voltage from the output signal line A of the column signal processing circuit 32A. A power saving control signal PSAVEA is a control signal supplied from the control circuit 60 to the power saving control signal line 105. A power saving control signal PSAVEB is a control signal supplied from the control circuit 60 to the power saving control signal line 106. When a control signal is at the L-level, a MOS transistor corresponding to this control signal is in the OFF-state, while a control signal is at the H-level, a MOS transistor corresponding to this control signal is in the ON-state. Note that a bias voltage Vb supplied to the bias voltage signal line 112 and a reference voltage Vref supplied to the reference voltage signal line 113 are constant over the period in which the operation shown in FIG. 5 is performed, and thus those voltages are not shown in FIG. 5. The bias voltage signal lines 112, the reference voltage signal lines 113, and the clamp control signal lines 114 for the column signal processing circuit 32A and the column signal processing circuit 32B are connected in a similar manner, and thus these signal lines are represented by a single signal line in FIG. 4.

During the period shown in FIG. 5, the power saving control signal PSAVEA is at the H-level, and the N-type MOS transistor M15A is in the ON-state, while the power saving control signal PSAVEB is at the L-level and the N-type MOS transistor M15B is in the OFF-state. Therefore, the column signal processing circuit 32A is in the driving state, and the column signal processing circuit 32B is in the power saving state.

At time t0, the control signal PRES supplied from the vertical scanning circuit 20 to the drive signal line 14 of a row subjected to a reading operation is at the H-level, and thus the reset transistors M2 of the two pixels 12 shown in FIG. 4 are in the ON-state. The FD part, which also functions as the input node of the amplification transistor M3, is connected to the power supply voltage line via the reset transistor M2 and is reset to a reset voltage depending on the power supply voltage.

At time t0, the control circuit 60 supplies the H-level control signal PC0R to the column reading circuit 30A. This causes the switch S2A to turn on, and thus the output terminal and the inverting input terminal of the differential amplifier circuit of the column signal processing circuit 32A are short-circuited to each other and the differential amplifier circuit goes to the buffering state.

Furthermore, at time t0, the vertical scanning circuit 20 supplies the H-level control signal PSEL to the drive signal line 14 of a row subjected to the reading operation. As a result, the selection transistor M4 goes to the ON-state, and the amplification transistor M3 goes to a state in which a bias current is suppled from the current source 18 via the selection transistor M4 and the vertical signal line 16A and thus a source follower is formed. In this state, thus, a signal (reset signal) corresponding to a voltage (reset voltage) at the input node of the amplification transistor M3 is output to the column signal processing circuit 32A via the selection transistor M4 and the vertical signal line 16A. In FIG. 4, the vertical signal lines 16A respectively connected to the two pixel 12 are connected to each other via the switch S3, and thus the signal input to the column signal processing circuit 32A is given by the mean value of the reset signals output from the two respective pixels 12. The reset signal input to the column signal processing circuit 32A is input via the capacitor C0A to the inverting input terminal of the differential amplifier circuit which is in the state where the output of the reference voltage Vref is buffered.

Next, at time t1, the vertical scanning circuit 20 changes the control signal PRES from the H-level to the L-level, thereby turning off the reset transistor M2. As a result, the reset operation on the input node of the amplification transistor M3 is stopped.

Next, at time t2, the control circuit 60 changes the control signal POOR from the H-level to the L-level thereby turning off the switch S2A. As a result, the reset signal level is clamped to the reference voltage Vref via the capacitor C0A. After time t2, at the output terminal of the column signal processing circuit 32A, a voltage (output voltage Vo) equal to the reference voltage Vref plus a clamp offset level is output.

This reset signal output from the column signal processing circuit 32A is subjected to the analog-to-digital conversion process during a period from time t2 to time t4. Herein it is assumed that the analog-to-digital conversion value for the reset signal level has been determined by time t3.

Next, at time t5, the vertical scanning circuit 20 changes the control signal PTX from the L-level to the H-level thereby turning on the transfer transistor M1. As a result, the charge generated in the photodiode PD is transferred to the FD part. To the vertical signal line 16A, a signal (pixel signal) based on the voltage at the input node of the amplification transistor M3 depending on the amount of the charge transferred to the FD part is output via the selection transistor M4. The pixel signal input to the column signal processing circuit 32A is given by the mean value of pixel signals output from the two pixels 12 shown in FIG. 4. The output voltage Vo from the column signal processing circuit 32A changes depending on a change in a voltage on the vertical signal line 16A.

Next, at time t6, the vertical scanning circuit 20 changes the control signal PTX from the H-level to the L-level thereby turning off the transfer transistor M1.

The pixel signal output from the column signal processing circuit 32A is subjected to the analog-to-digital conversion process during a period from time t6 to time t7. Herein it is assumed that the analog-to-digital conversion value for the pixel signal level has been determined by time t6.

In the above-described period from time t2 to time t4, leakage light incident on the FD part or other factors may cause a change to occur in the reset level clamped at time t2, which may cause the output voltage Vo to change, for example, in a manner as represented by a dotted line in the timing chart shown in FIG. 5. In such a situation, if an analog-to-digital conversion level of the reset signal (N-signal) is determined at time t3, and an analog-to-digital conversion level of the pixel signal (S-signal) is determined at time t6, then an S-N level is given by A in FIG. 5, and thus a reduction in dynamic range occurs. That is, the output signal becomes smaller than a true output level, which causes blocked-up shadows to occur in a resultant image.

In the present embodiment, to handle the above-described situation, the clipping circuit 36 is disposed in each column signal processing circuit 32 to limit the maximum values of the reset signal and the pixel signal. In a case where the output voltage Vo of the column signal processing circuit 32A is higher than the clip voltage VclA by an amount equal to or larger than the threshold voltage of the P-type MOS transistor M17A, the P-type MOS transistor M17A turns on, and thus a current flows to the current source (N-type MOS transistor M16A). Therefore, by properly setting the clip voltage VclA, it is possible to limit the maximum values of the reset signal and the pixel signal to a particular value.

In the sequence of reading operation steps described above, the clip voltage VclA supplied to the clip voltage signal line 107 is set to voltage NCLIP_LEVEL for the period from time t0 to time t4 and to voltage SCLIP_LEVEL for the period from time t4 to time t7. This makes it possible to clip the maximum value of the reset signal to a voltage value depending on the voltage NCLIP_LEVEL and clip the maximum value of the pixel signal to a voltage value depending on the voltage SCLIP_LEVEL. In this case, the S-N level is given by B in FIG. 5, and thus a sufficiently large dynamic range is obtained.

The output voltage Vo of the column signal processing circuit 32A changes depending on the optical signal. However, the column signal processing circuit 32B is in the power saving state because the power saving signal PSAVEB is at the L-level, and thus the change in the output voltage Vo of the column signal processing circuit 32B is different from the change in the output voltage Vo of the column signal processing circuit 32A. Therefore, if the clip voltage signal line is shared by the column signal processing circuit 32A and the column signal processing circuit 32B, crosstalk may occur between them via the clip voltage signal line, which may influence the output voltage Vo of the column signal processing circuit 32A.

To handle the above situation, in the solid-state image pickup apparatus 100 according to the present embodiment, the clip voltage signal line 107 for supplying the clip voltage VclA to the column signal processing circuit 32A and the clip voltage signal line 108 for supplying the clip voltage Vc1B to the column signal processing circuit 32B are provided by different signal lines. This reduces the influence of the crosstalk between the column signal processing circuit 32A and the column signal processing circuit 32B via the clip voltage signal line. Note that in the present description, different signal lines refer to signal lines formed by conductive patterns isolated from each other at least in an area where the column reading circuit 30 is disposed.

The clip voltage Vc1B supplied to the clip voltage signal line 108 of the column signal processing circuit 32B in the power saving state may be set to a constant voltage equal to the voltage NCLIP_LEVEL as shown in FIG. 5. Alternatively, as shown in FIG. 6, it may be equal, in the waveform, to the clip voltage Vc1A supplied to the clip voltage signal line 107 of the column signal processing circuit 32A. In either case, it is possible to achieve a similar effect in reducing the crosstalk.

Note that there is a possibility that crosstalk between adjacent column signal processing circuits 32 may occur via any wiring shared by the adjacent column signal processing circuits 32. That is, there is a possibility that in addition to the clip voltage signal lines 107 and 108, similar crosstalk may occur via the bias voltage signal line 112, the reference voltage signal line 113, or the clamp control signal line 114. In view of the above, the bias voltage signal line 112, the reference voltage signal line 113, and the clamp control signal line 114 each may be provided by signal lines different between the column signal processing circuit 32A used in the driving state and the column signal processing circuit 32B used in the power saving state. By employing different independent wiring for signal lines for use by the column signal processing circuits 32A and 32B in terms of each of the signal lines described above, it becomes possible to realize a solid-state image pickup apparatus that may satisfy requirements for higher sensitivity, higher gain, and higher signal-to-noise ratio.

In general, signals lines driven by pulses (for example, the clamp control signal line 114) and signal lines that transmit constant analog signals (for example, the bias voltage signal line 112, the reference voltage signal line 113) do not make a large contribution to crosstalk. Therefore, to effectively reduce influences of crosstalk without making a significantly large change in circuit configuration or without needing a complicated circuit configuration, independent different lines may be employed only for signal lines that convey analog signals varying with time, such as the clip voltage signal line.

In the embodiment described above, the driving method includes the analog-to-digital conversion process. Alternatively, the N-signal and the S-signal may be respectively stored in analog memories without performing the analog-to-digital conversion process, and the analog-to-digital conversion may be performed later.

According to the present embodiment, as described above, it is possible to effectively reduce crosstalk between a column signal processing circuit which is not in the power saving state and a column signal processing circuit which is in the power saving state. This makes it possible to achieve a solid-state image pickup apparatus capable of capturing an image with high image quality.

Second Embodiment

Figure 7:
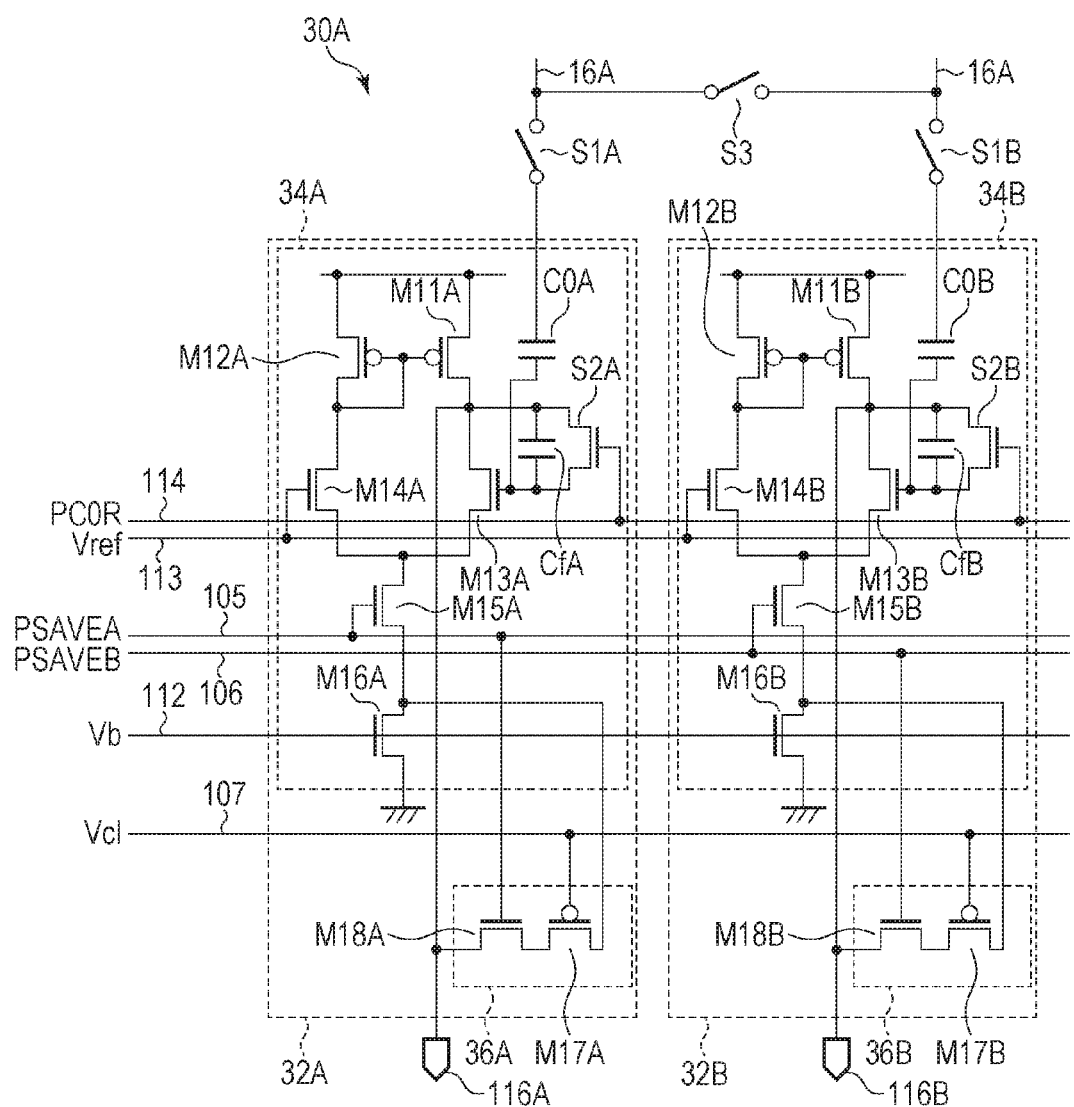
FIG. 7 is a circuit diagram illustrating a circuit configuration of a column reading circuit of a solid-state image pickup apparatus according to a second embodiment.

A solid-state image pickup apparatus and a method of driving it according to a second embodiment are described below with reference to FIG. 7. In FIG. 7, elements similar to those of the solid-state image pickup apparatus according to the first embodiment shown in FIG. 1 to FIG. 6 are denoted by similar reference symbols/numerals, and a further description thereof is omitted or simplified. FIG. 7 is a circuit diagram illustrating an example of a configuration of a column reading circuit of the solid-state image pickup apparatus according to the second embodiment.

The solid-state image pickup apparatus according to the present embodiment is similar to the solid-state image pickup apparatus according to the first embodiment except that the clipping circuits 36A and 36B are different in configuration from those according to the first embodiment.

That is, in the present embodiment, the clipping circuit 36A includes a P-type MOS transistor M17A and an N-type MOS transistor M18A as shown in FIG. 7. A source of the P-type MOS transistor M17A is connected to a connection node between a source of the N-type MOS transistor M15A and a drain of the N-type MOS transistor M16A. A drain of the P-type MOS transistor M17A is connected to a source of the N-type MOS transistor M18A. A drain of the N-type MOS transistor M18A is connected to an output node of a differential amplifier circuit.

Similarly, the clipping circuit 36B includes a P-type MOS transistor M17B and an N-type MOS transistor M18B. A source of the P-type MOS transistor M17B is connected to a connection node between a source of the N-type MOS transistor M15B and a drain of the N-type MOS transistor M16B. A drain of the P-type MOS transistor M17B is connected to a source of the N-type MOS transistor M18B. A drain of the N-type MOS transistor M18B is connected to the output node of the differential amplifier circuit.

A gate of the P-type MOS transistor M17A of the clipping circuit 36A and a gate of the P-type MOS transistor M17B of the clipping circuit 36B are connected to a common clip voltage signal line 107 for supplying a clip voltage Vcl. A gate of the N-type MOS transistor M18A of the clipping circuit 36A is connected to a power saving control signal line 105. A gate of the N-type MOS transistor M18B of the clipping circuit 36B is connected to a power saving control signal line 106.

In the solid-state image pickup apparatus according to the present embodiment, as described above, the clip voltage signal line for supplying the clip voltage to the clipping circuit 36A of the column signal processing circuit 32A and the clip voltage signal line for supplying the clip voltage to the clipping circuit 36B of the column signal processing circuit 32B are provided by the same signal line. However, in the solid-state image pickup apparatus according to the present embodiment, the N-type MOS transistor M18A of the clipping circuit 36A is controlled by a control signal PSAVEA supplied to the power saving control signal line 105, and the N-type MOS transistor M18B of the clipping circuit 36B is controlled by a control signal PSAVEB supplied to the power saving control signal line 106. That is, only when the column signal processing circuit 32A is in the driving state, the clipping circuit 36A is in an operating state and performs a clipping operation on the output voltage Vo. On the other hand, only when the column signal processing circuit 32B is in the driving state, the clipping circuit 36B is in an operating state and performs a clipping operation on the output voltage Vo. When the column signal processing circuits 32A and 32B are in the power saving state, the clipping circuits 36A and 36B are disconnected from the output signal lines 116A and 116B and go into the non-operating state.

Thus, an influence of a change in the clip voltage signal line 107 is reduced by the N-type MOS transistors M18A and 18B. Therefore, even in the case in which the clip voltage signal line 107 is shared by the column signal processing circuits 32A and 32B, it is possible to achieve an effect similar to that achieved in the first embodiment.

Thus, according to the present embodiment, it is possible to effectively reduce crosstalk between a column signal processing circuit which is not in the power saving state and a column signal processing circuit which is in the power saving state. This makes it possible to achieve a solid-state image pickup apparatus capable of capturing an image with high image quality.

Third Embodiment

A solid-state image pickup apparatus and a method of driving it according to a third embodiment are described below with reference to FIG. 8 to FIG. 12. In FIG. 8 to FIG. 12, elements similar to those of the solid-state image pickup apparatus according to the first embodiment or second embodiment shown in FIG. 1 to FIG. 7 are denoted by similar reference symbols/numerals, and a further description thereof is omitted or simplified.

Figure 8:
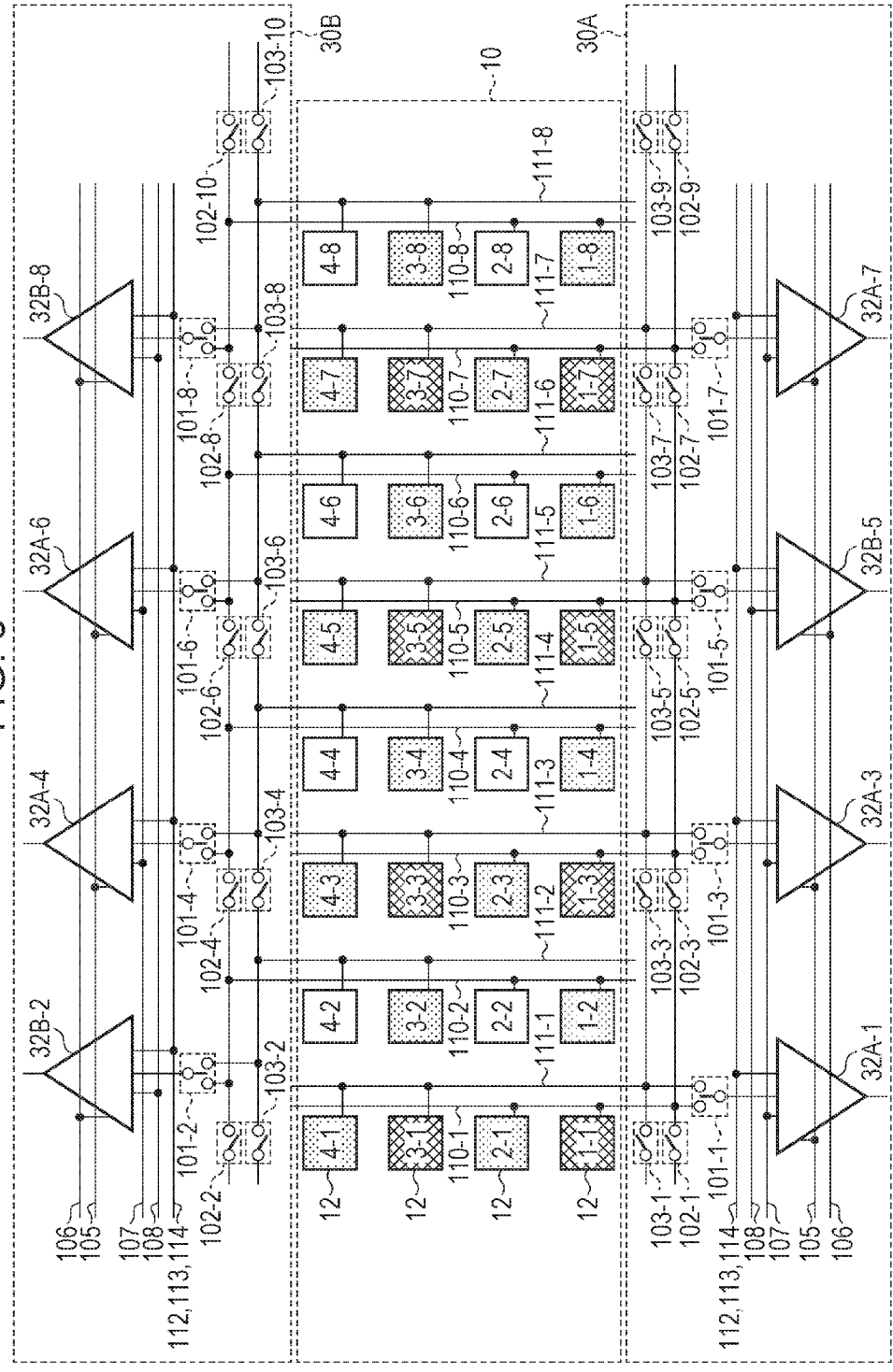
FIG. 8 a block diagram illustrating an example of a configuration of a solid-state image pickup apparatus according to a third embodiment.
Figure 9:
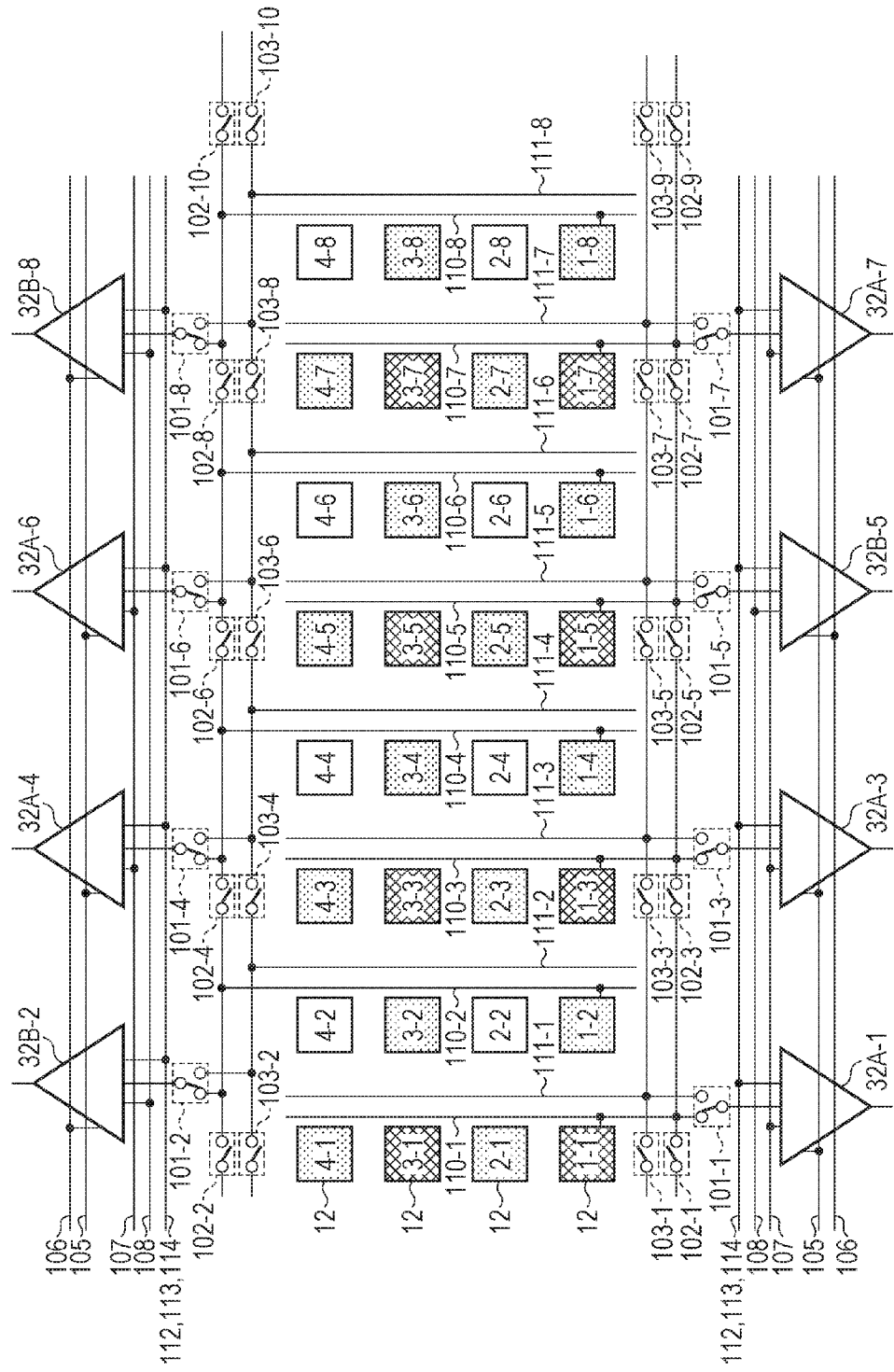
FIG. 9 is a circuit diagram illustrating a method of driving the solid-state image pickup apparatus according to the third embodiment.
Figure 10:
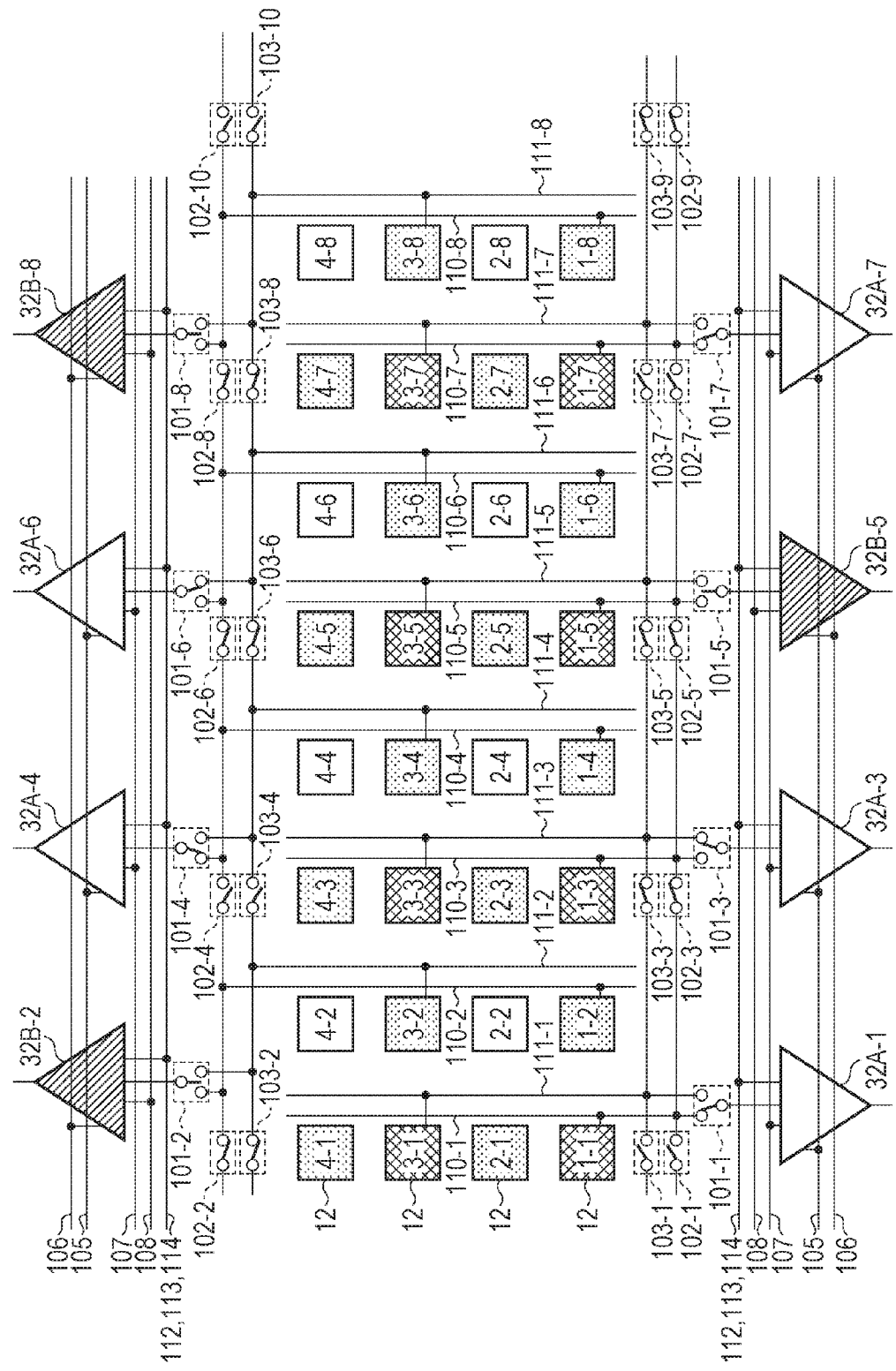
FIG. 10 is a circuit diagram (second one) illustrating a method of driving the solid-state image pickup apparatus according to the third embodiment.
Figure 11:
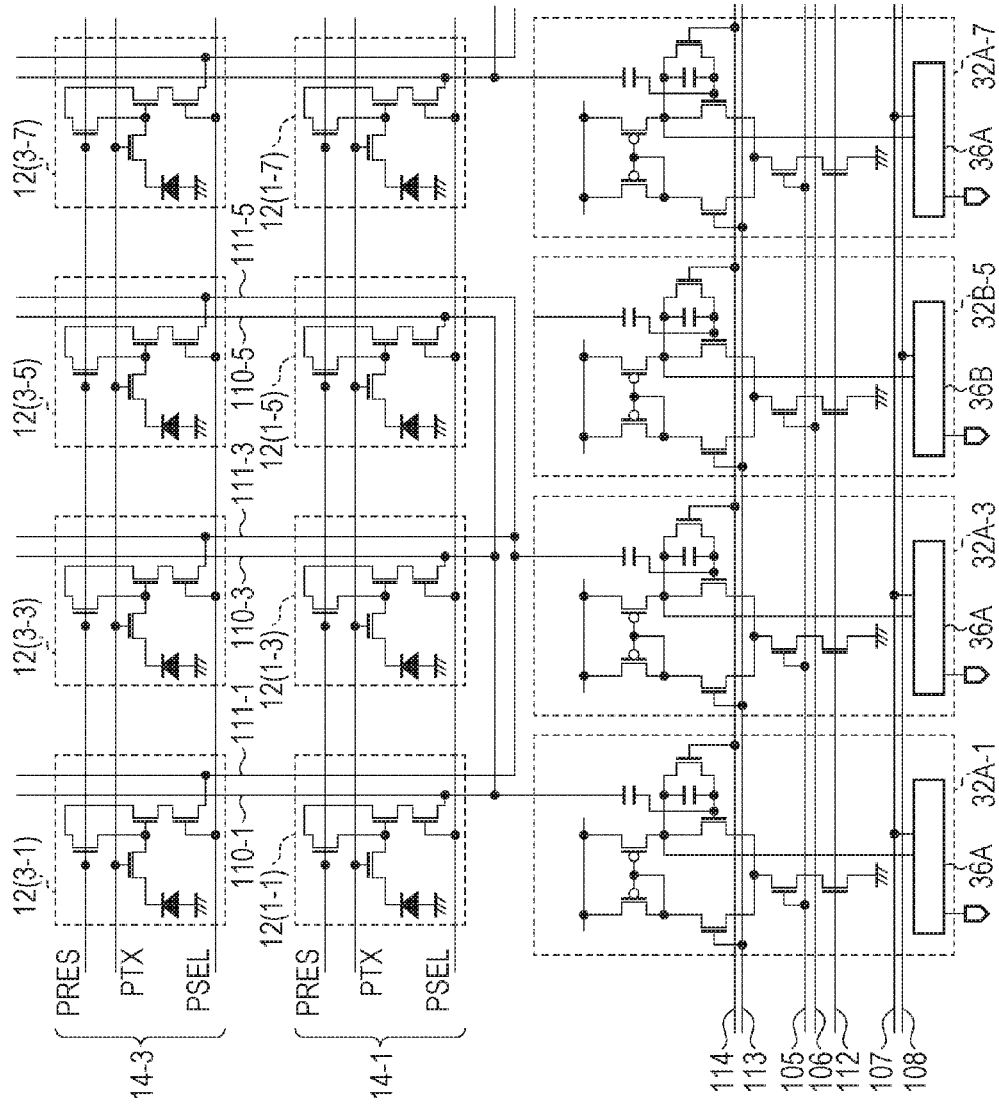
FIG. 11 is a circuit diagram (third one) illustrating a method of driving the solid-state image pickup apparatus according to the third embodiment.
Figure 12:
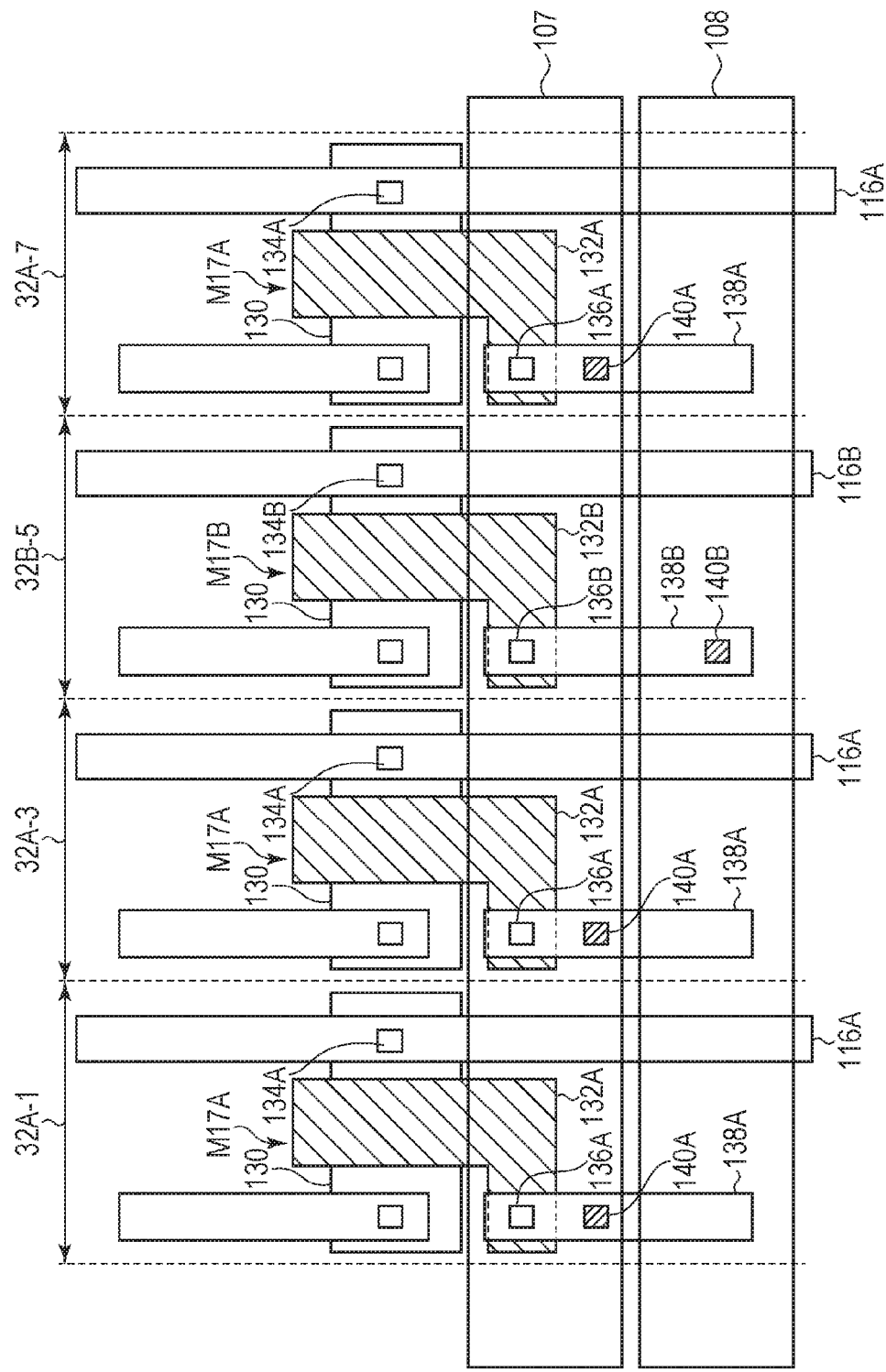
FIG. 12 is a plan view illustrating an example of a layout of a clipping circuit of the solid-state image pickup apparatus according to the third embodiment.

FIG. 8 is a block diagram illustrating an example of a configuration of a solid-state image pickup apparatus according to the third embodiment. FIG. 9 to FIG. 11 are circuit diagrams illustrating a method of driving the solid-state image pickup apparatus according to the present embodiment. FIG. 12 is a plan view illustrating an example of a layout of a clipping circuit of the solid-state image pickup apparatus according to the present embodiment.

First, a structure of the solid-state image pickup apparatus according to the present embodiment is described below with reference to FIG. 8.

The solid-state image pickup apparatus according to the present embodiment is basically similar in configuration to the solid-state image pickup apparatus according to the present embodiment shown in FIG. 1. However, in the solid-state image pickup apparatus according to the present embodiment, pixels 12 in each column in the pixel array 10 are divided into two groups, which are respectively connected to different vertical signal lines. Although a switching circuit for connecting pixels 12 to the column signal processing circuit 32 is different in configuration from the switching circuit according to the first embodiment or the second embodiment, the basic operation thereof is similar to that of the solid-state image pickup apparatus according to the first embodiment or the second embodiment.

The solid-state image pickup apparatus according to the present embodiment is described in detail below with reference to FIG. 8 with a focus on differences from the solid-state image pickup apparatus according to the first embodiment or the second embodiment.

FIG. 8 illustrates 4-row×8-column pixels 12, which a part of the pixel array 10. Hereinafter, for convenience of illustration, a pixel 12 located in a bottom row and in a leftmost column in FIG. 8 is denoted as a 1st-row-1st-column pixel 12, and a pixel 12 located in a top row and in a rightmost column in FIG. 8 is denoted as a 4th-row-8th-column pixel 12. In FIG. 8, each pixel 12 is labelled with numerals indicating its row and column numbers. For example, a pixel 12 located in the top row and in the leftmost column in FIG. 8 is labelled with "4-1" indicating that this pixel 12 is located in the 4th row and in the 1st column. Note that the row numbers and the column numbers used herein by way of example are not necessarily the same as those of the actual pixel array 10. This applies also to other embodiments described later.

In FIG. 8, it is assumed by way of example that a Bayer arrangement is employed in the pixel array 10, and the pixels 12 in the pixel array 10 are shaded in three different manners to represents the Bayer arrangement. For example, a pixel 12 in the 2nd row and in 1st column and pixels 12 shaded in the same manner may be green pixels, a pixel 12 in the 1st row and in the 1st column and pixels 12 shaded in the same manner may be red pixels, and a pixel 12 in the 2nd row and in the 2nd column and pixels 12 shaded in the same manner may be blue pixels.

In each column of the pixel array 10, two vertical signal lines 110 and 111 are disposed. The pixels 12 in each column are divided into two groups such that pixels 12 in one group are connected to the vertical signal line 110 and pixels 12 in the other group are connected to the vertical signal line 111. In the example shown in FIG. 8, pixels 12 in the 1st and 2nd rows are connected to the vertical signal line 110, while pixels 12 in the 3rd and 4th rows are connected to the vertical signal line 111. In FIG. 8, to indicate which column each element belongs to, a suffix following a hyphen is added to a symbol/numeral denoting the element. For example, vertical signal lines 110 and 111 in the 1st column are respectively denoted by "110-1" and "111-1".

In FIG. 8, vertical signal lines 110 and 111 in odd-numbered columns are connected to the column reading circuit 30A. On the other hand, vertical signal lines 110 and 111 in even-numbered columns are connected to the column reading circuit 30B. The vertical signal lines 110 and 111 in each column are connected to the column signal processing circuit 32 via a selection switch 101. The selection switch 101 is for selecting one of the vertical signal lines 110 and 111 and connecting the selected one to the column signal processing circuit 32. In the present embodiment, it is assumed by way of example that the column signal processing circuits 32 connected to the vertical signal lines 110 and 111 in the 1st, 3rd, 4th, 6th, and 5th columns are each realized using the column signal processing circuit 32A shown in FIG. 3 or FIG. 7. It is also assumed by way of example that the column signal processing circuits 32 connected to the vertical signal lines 110 and 111 in the 2nd, 5th, and 8th columns are each realized using the column signal processing circuit 32B shown in FIG. 3 or FIG. 7.

One switch 102 is disposed between each two adjacent vertical signal lines 110 connected to the same one of the column reading circuits 30A and 30B, and one switch 103 is disposed between each two adjacent vertical signal lines 111 connected to the same one of the column reading circuits 30A and 30B. For example, a switch 102-3 is disposed between the adjacent vertical signal lines 110-1 and the vertical signal line 110-3 connected to the column reading circuits 30A, while a switch 103-4 is disposed between the adjacent vertical signal lines 111-2 and the vertical signal line 111-4 connected to the column reading circuits 30B. Note that the switches 102 and 103 are switches corresponding to the switch S3 shown in FIG. 3 or FIG. 7. In the present description, a circuit including the selection switch 101 and the switches 102 and 103 for switching the connection between the vertical signal lines and the column signal processing circuits is also referred to as a "switching circuit".

Next, a method of driving the solid-state image pickup apparatus according to the present embodiment is described below with reference to FIG. 9 to FIG. 11 for a case where pixel signals from the respective columns are output from the corresponding column signal processing circuits 32 and for a case where pixel signals from a plurality of pixels is arithmetically averaged, and a resultant signal is output from part of the column signal processing circuits 32.

First, referring to FIG. 9, the example is described in which pixel signals in each column is output from a corresponding one of the column signal processing circuits 32. FIG. 9 shows a conductive state employed in a case where signals are output from pixels 12 in respective columns in the first row. In this case, the selection switch 101 of each column selects a corresponding one of the vertical signal lines 110. In this driving mode, the switches 102 and 103 are set in the non-conductive state (OFF-state). By controlling the switching circuit in the above-described manner, it is possible to output the signals read from the pixels 12 in the respective columns from the column signal processing circuits 32 corresponding to the respective columns.

In the present driving mode, the column signal processing circuits 32A and 32B are both set in the driving state. More specifically, an H-level control signal is supplied to the power saving control signal line 105 connected to the column signal processing circuit 32A, and a clip voltage VclA is supplied to the clip voltage signal line 107. Furthermore, an H-level control signal, as with the control signal supplied to the power saving control signal line 105, is supplied to the power saving control signal line 106 connected to the column signal processing circuit 32B, and the clip voltage VclA same as that supplied to the clip voltage signal line 107 is supplied to the clip voltage signal line 108.

Next, an example of a driving operation is described below with reference to FIG. 10 and FIG. 11 for a case in which pixel signals from a plurality of pixels are arithmetically averaged and a resultant signal is output from part of the column signal processing circuits 32.

FIG. 10 shows a conductive state employed in a case where signals from three pixels 12 are arithmetically averaged and a resultant signal is read out. In the example shown in FIG. 10, signals from pixels 12 in the 1st, 3rd, and 5th columns in the 1st row are arithmetically averaged, and a resultant signal is output from the column signal processing circuit 32A-1. Similarly, signals from pixels 12 in the 1st, 3rd, and 5th columns in the 3rd row are arithmetically averaged, and a resultant signal is output from the column signal processing circuit 32A-3. Signals from pixels 12 in the 4th, 6th, and 8th columns in the 1st row are arithmetically averaged, and a resultant signal is output from the column signal processing circuit 32A-4. Signals from pixels 12 in the 4th, 6th, and 8th columns in the 3rd row are arithmetically averaged, and a resultant signal is output from the column signal processing circuit 32A-6. Note that these signals are read out with the same timing.

More specifically, as shown in FIG. 10, the selection switches 101-1, 101-7, and 101-4 each select corresponding one of the vertical signal lines 110, while the selection switches 101-3 and 101-6 each select corresponding one of the vertical signal lines 111. The selection switches 101-2, 101-5, and 101-8 are set in the non-conductive state (OFF-state). The switches 102-3, 102-5, 102-9, 102-2, 102-6, 102-8, 103-3, 103-5, 103-9, 103-2, 103-6, and 103-8 are set in the conductive state (ON-state). The switches 102-1, 102-7, 102-4, 102-10, 103-1, 103-7, 103-4, and 103-10 are set in the non-conductive state (OFF-state).

By controlling the switching circuit in the above-described manner, the 1st-row-1st-column pixel 12 (the pixel (1-1)) is connected to the column signal processing circuit 32A-1 via the vertical signal line 110-1 and the selection switch 101-1. The pixel 12 in the 1st row in the 3rd column (the pixel 12 (1-3)) is connected to the column signal processing circuit 32A-1 via the vertical signal line 110-3, the switch 102-3, and the selection switch 101-1. The pixel 12 in the 1st row in the 5th column (the pixel 12 (1-5)) is connected to the column signal processing circuit 32A-1 via the vertical signal line 110-5, the switches 102-5 and 102-3, and the selection switch 101-1. As a result, the output signals from these pixels 12 are arithmetically averaged and input to the column signal processing circuit 32A-1.

The pixel 12 in the 3rd row in the 1st column (the pixel 12 (3-1)) is connected to the column signal processing circuit 32A-3 via the vertical signal line 111-1, the switch 103-3, and the selection switch 101-3. The pixel 12 in the 3rd row in the 3rd column (the pixel 12 (3-3)) is connected to the column signal processing circuit 32A-3 via the vertical signal line 111-3 and the selection switch 101-3. The pixel 12 in the 3rd row in the 5th column (the pixel 12 (3-5)) is connected to the column signal processing circuit 32A-3 via the vertical signal line 111-5, the switch 103-5, and the selection switch 101-3. As a result, the output signals from these pixels 12 are arithmetically averaged and input to the column signal processing circuit 32A-3.

The pixel 12 in the 1st row in the 4th column (the pixel 12 (1-4)) is connected to the column signal processing circuit 32A-4 via the vertical signal line 110-4 and the selection switch 101-4. The pixel 12 in 1st row in the 6th column (the pixel 12 (1-6)) is connected to the column signal processing circuit 32A-4 via the vertical signal line 110-6, the switch 102-6, and the selection switch 101-4. The pixel 12 in the 1st row in the 8th column (the pixel 12 (1-8)) is connected to the column signal processing circuit 32A-4 via the vertical signal line 110-8, the switches 102-8 and 102-6, and the selection switch 101-4. As a result, the output signals from these pixels 12 are arithmetically averaged and input to the column signal processing circuit 32A-4.

The pixel 12 in the 3rd row in the 4th column (the pixel 12 (3-4)) is connected to the column signal processing circuit 32A-6 via the vertical signal line 111-4, the switch 103-6, and the selection switch 101-6. The pixel 12 in the 3rd row in the 6th column (the pixel 12 (3-6)) is connected to the column signal processing circuit 32A-6 via the vertical signal line 111-6 and the selection switch 101-6. The pixel 12 in the 3rd row in the 8th column (the pixel 12 (3-8)) is connected to the column signal processing circuit 32A-6 via the vertical signal line 111-8, the switch 103-8, and the selection switch 101-6. As a result, the output signals from these pixels 12 are arithmetically averaged and input to the column signal processing circuit 32A-6.

In the present driving mode, as described above, the column signal processing circuits 32B-2, 32B-5, and 32B-8 are not used, and thus they are set into the power saving state. In FIG. 10, for easier visual understanding, blocks of column signal processing circuits 32B in the power saving state are shaded.

FIG. 11 is an equivalent circuit diagram illustrating a manner in which pixels 12 in the state shown in FIG. 10 are connected to a column reading circuit 30A. In FIG. 11, numerals in parentheses following "12" denoting a pixel represent a row number and a column number of a corresponding pixel 12 shown in FIG. 10. The clipping circuits 36A and 36B each may have a circuit configuration shown in FIG. 3 or a circuit configuration shown in FIG. 7.

Next, referring to timing charts shown in FIG. 5 and FIG. 6, a description is given below as to an example of a manner of reading out signals from pixels 12 in the 1st and 3rd rows in the conductive state shown in FIG. 10 and FIG. 11. A description of similar steps to those in the driving method according to the first embodiment is omitted or simplified, and the description focuses on differences.

At time t0, the control signal PRES supplied from the vertical scanning circuit 20 to the drive signal line 14 of rows (1st and 3rd rows) subjected to a reading operation is at the H-level, and thus the reset transistors M2 of the pixels 12 belonging to these rows are in the ON-state. The FD part, which also functions as the input node of the amplification transistor M3, is connected to the power supply voltage line via the reset transistor M2 and is reset to a reset voltage depending on the power supply voltage.

At time t0, The control circuit 60 is for supplying signals to supplies the H-level control signal PC0R to the column reading circuits 30A and 30B. This causes the switch S2A to turn on, and thus the output terminal and the inverting input terminal of the differential amplifier circuit of the column signal processing circuit 32A are short-circuited to each other and the differential amplifier circuit goes to the buffering state.

At time t0, the vertical scanning circuit 20 supplies the H-level control signal PSEL to the drive signal line 14 of rows (1st and 3rd rows) subjected to the reading operation.

As a result, the amplification transistor M3 of the pixel 12 subjected to the reading process is connected to a corresponding one of the vertical signal lines 110 and 111 via the selection transistor M4 and thus a signal (reset signal) depending on the voltage (reset voltage) at the input node of the amplification transistor M3 is output.

As a result, reset signals output from the 1st-row-1st-column pixel 12 (the pixel 12 (1-1)), the pixel 12 in the 1st row in the 3rd column (the pixel 12 (1-3)), and the pixel 12 in the 1st row in the 5th column (the pixel 12 (1-5)) are arithmetically averaged and input to the column signal processing circuit 32A-1. Reset signals output from the pixel 12 in the 3rd row in the 1st column (the pixel 12 (3-1)), the pixel 12 in the 3rd row in the 3rd column (the pixel 12 (3-3)), and the pixel 12 in the 3rd row in the 5th column (the pixel 12 (3-5)) are arithmetically averaged and input to the column signal processing circuit 32A-3. Reset signals output from the pixel 12 in the 1st row in the 4th column (the pixel 12 (1-4)), the pixel 12 in the 1st row in the 6th column (the pixel 12 (1-6)), and the pixel 12 in the 1st row in the 8th column (the pixel 12 (1-8)) are arithmetically averaged and input to the column signal processing circuit 32A-4. Reset signals output from the pixel 12 in the 3rd row in the 4th column (the pixel 12 (3-4)), the pixel 12 in the 3rd row in the 6th column (the pixel 12 (3-6)), and the pixel 12 in the 3rd row in the 8th column (the pixel 12 (3-8)) are arithmetically averaged and input to the column signal processing circuit 32A-6. Hereinafter, the arithmetically averaged reset signal will also referred to simply as a "reset signal".

Next, at time t1, the vertical scanning circuit 20 changes control signal PRES in rows (1st and 3rd rows) subjected to the reading process from the H-level to the L-level, thereby turning off the reset transistor M2. As a result, the reset operation on the input node of the amplification transistor M3 of the pixel 12 subjected to the reading process is stopped.

Next, at time t2, the control circuit 60 changes control signal POOR supplied to the column reading circuits 30A and 30B from the H-level to the L-level, thereby turning off the switch S2A. As a result, the reset signal level is clamped to the reference voltage Vref via the capacitor C0A. After time t2, at the output terminal of the column signal processing circuit 32A, a voltage (output voltage Vo) equal to the reference voltage Vref plus a clamp offset level is output.

Next, at time t5, the vertical scanning circuit 20 changes control signal PTX in rows (1st and 3rd rows) subjected to the reading process from the L-level to the H-level thereby turning on the transfer transistor M1. As a result, in the pixel 12 subjected to the reading process, the charge generated in the photodiode PD is transferred to the FD part. Thus the amplification transistor M3 of the pixel 12 subjected to the reading process is connected to a corresponding one of the vertical signal lines 110 and 111 via the selection transistor M4 and a signal (pixel signal), based on the voltage at the input node of the amplification transistor M3 depending on the amount of the charge transferred to the FD part, is output.

The operations of the clipping circuits 36A and 36B are similar to those according to the first embodiment or the second embodiment. That is, an H-level power saving control signal PSAVEA is supplied to a power saving control signal line 105 connected to a column signal processing circuit 32A to be set in the driving state. On the other hand, an L-level power saving control signal PSAVEB is supplied to a power saving control signal line 106 connected to a column signal processing circuit 32B to be set in the power saving state. To the clip voltage signal lines 107 and 108, voltages VclA and VclB similar to those shown in FIG. 5 or FIG. 6 are supplied. As a result, it is possible to read out a signal indicating an arithmetically averaged signals from a plurality of pixels 12 while reducing crosstalk occurring via a clip voltage signal line from a column signal processing circuit 32B in the power saving state.

The effect of the reduction in crosstalk is great in particular for a layout in which column signal processing circuits 32 are not line-symmetrical about a center line extending in a column direction. An example of an influence of a layout of clipping circuits 36 on crosstalk is described below for a case where the clipping circuits 36 are laid out as shown in FIG. 12.

FIG. 12 shows an example of a layout of one of clipping circuits 36 of the column signal processing circuits 32A-1, 32A-3, 32B-5, and 32A-7. The P-type MOS transistor M17A and M17B each include a gate electrode 132 disposed on an active region 130 of a semiconductor substrate. A source of the P-type MOS transistor M17A is connected via a contact part 134A to the vertical signal line 116A extending in the column direction. A gate electrode 132A of the P-type MOS transistor M17A is connected to the clip voltage signal line 107 via a contact part 136A, a conductive element 138A, and a contact part 140A. A source of the P-type MOS transistor M17B is connected via a contact part 134B to the output signal line 116B extending in the column direction. A gate electrode 132B of the P-type MOS transistor M17B is connected to the clip voltage signal line 108 via a contact part 136B, a conductive element 138B, and a contact part 140B.

In a case where the output signal line 116 of the column signal processing circuit 32 is disposed at a location shifted from a center line in the column direction, for example, as shown in FIG. 12, influences of crosstalk on adjacent column signal processing circuits 32 may be different between right and left column signal processing circuits 32. For example, a change occurs in the voltage on the output signal line 116B of the column signal processing circuit 32B-5, a corresponding change occurs in the voltage on the gate electrode 132B of the P-type MOS transistor M17B. In such a situation, because the output signal line 116A of the column signal processing circuit 32A-3 is located close to the conductive element 138B of the column signal processing circuit 32B, and thus coupling between them may cause the output signal line 116A of the column signal processing circuit 32A-3 to easily receive an influence from the change in the voltage on the conductive element 138B, that is, the gate electrode 132B. In particular, when the gate electrode 132B is connected to the clip voltage signal line 107, an increase in coupling occurs via the clip voltage signal line 107, which results in an increase in the influence of the change in the voltage on the gate electrode 132B on the output signal line 116A of the column signal processing circuit 32A-3. On the other hand, the output signal line 116A of the column signal processing circuit 32A-7 is located apart from the output signal line 116B and the gate electrode 132B of the column signal processing circuit 32B-5, and thus an influence of the crosstalk from the column signal processing circuit 32B-5 is small. In such a case, a column-to-column difference or a row-to-row difference may occur due to a difference in the influence of crosstalk from the column signal processing circuit 32B-5 between the column signal processing circuit 32A-3 and the column signal processing circuit 32A-7, which may affect image quality.

In the present embodiment, to handle the situation described above, the clip voltage to the column signal processing circuit 32A in the driving state and the clip voltage to the column signal processing circuit 32B in the power saving state are supplied via different clip voltage signal lines. This also makes it possible to reduce the influence of the layout of the column signal processing circuit 32.

The influence originating from the layout may occur in a case where there exists a mixture of column signal processing circuits 32 in the power saving state are located only on one side and column signal processing circuits 32 in the power saving state are located only on the opposite side. In other words, the influence may occur in a case where at least two column signal processing circuits 32 in the driving state are located adjacent to each other.

According to the present embodiment, as described above, it is possible to effectively reduce crosstalk between a column signal processing circuit which is not in the power saving state and a column signal processing circuit which is in the power saving state. This makes it possible to achieve a solid-state image pickup apparatus capable of capturing an image with high image quality.

Fourth Embodiment

Figure 13:
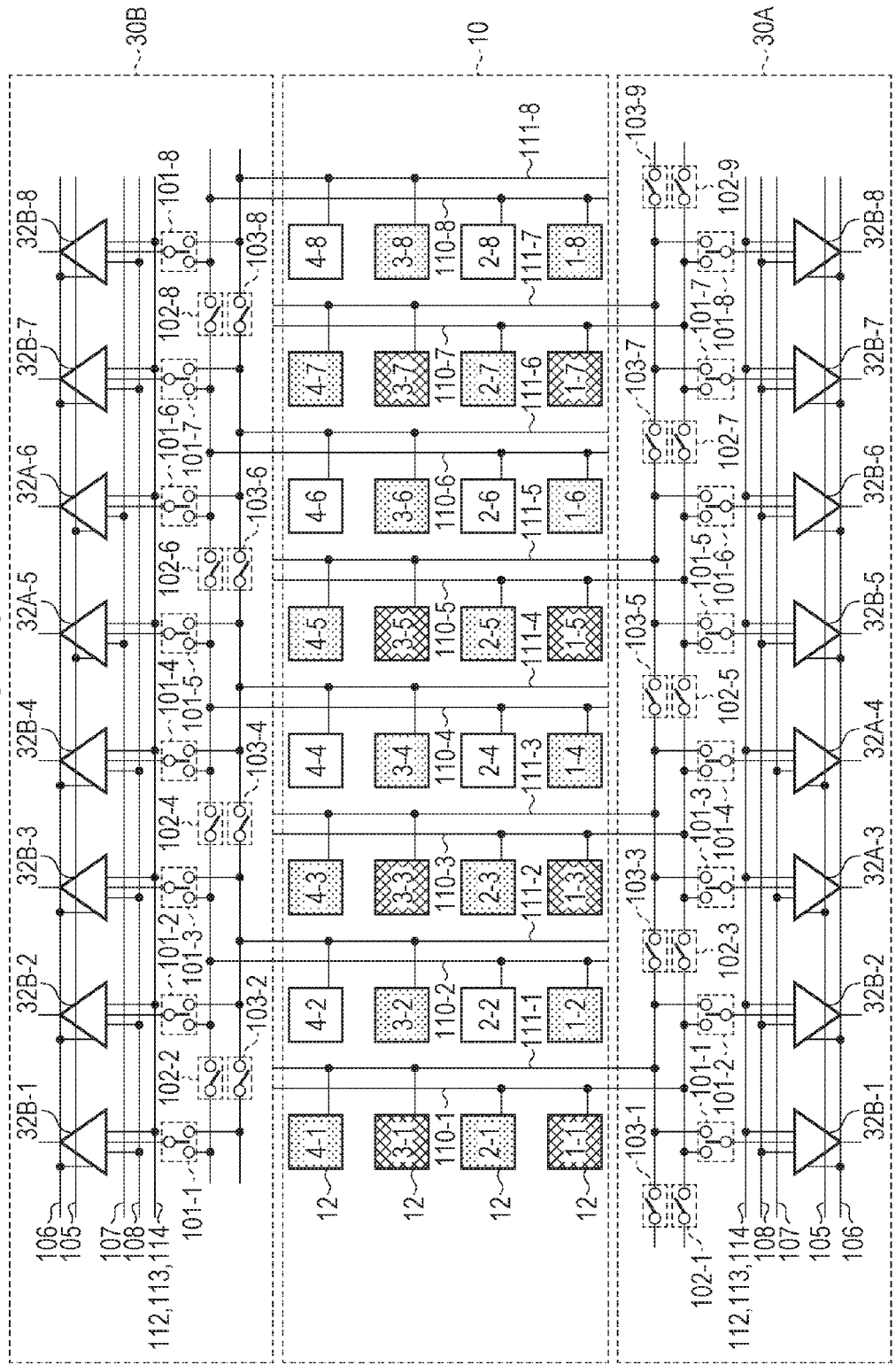
FIG. 13 is a circuit diagram illustrating an example of a configuration of a solid-state image pickup apparatus according to a fourth embodiment.
Figure 14:
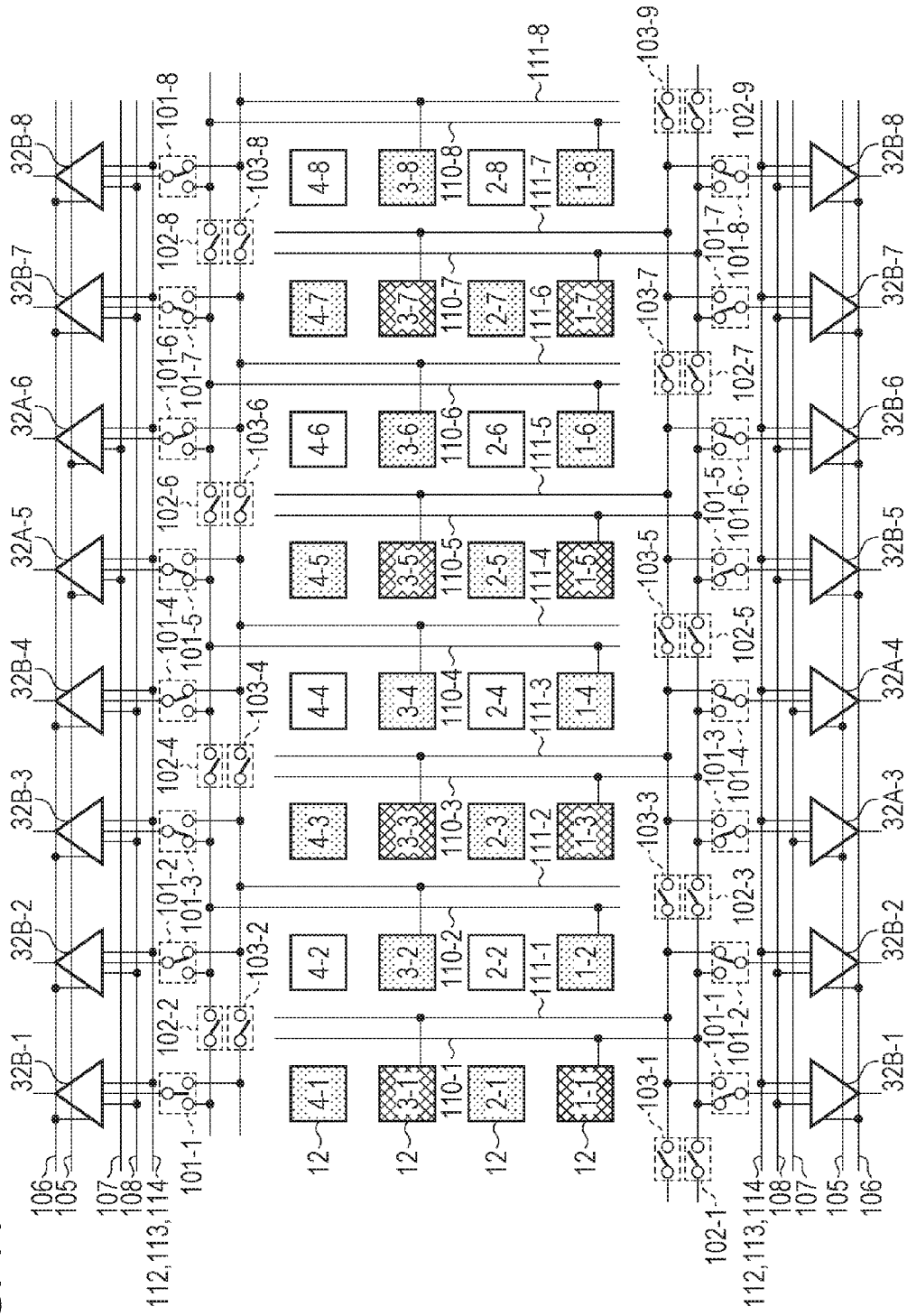
FIG. 14 is a circuit diagram (first one) illustrating a method of driving the solid-state image pickup apparatus according to the fourth embodiment.
Figure 15:
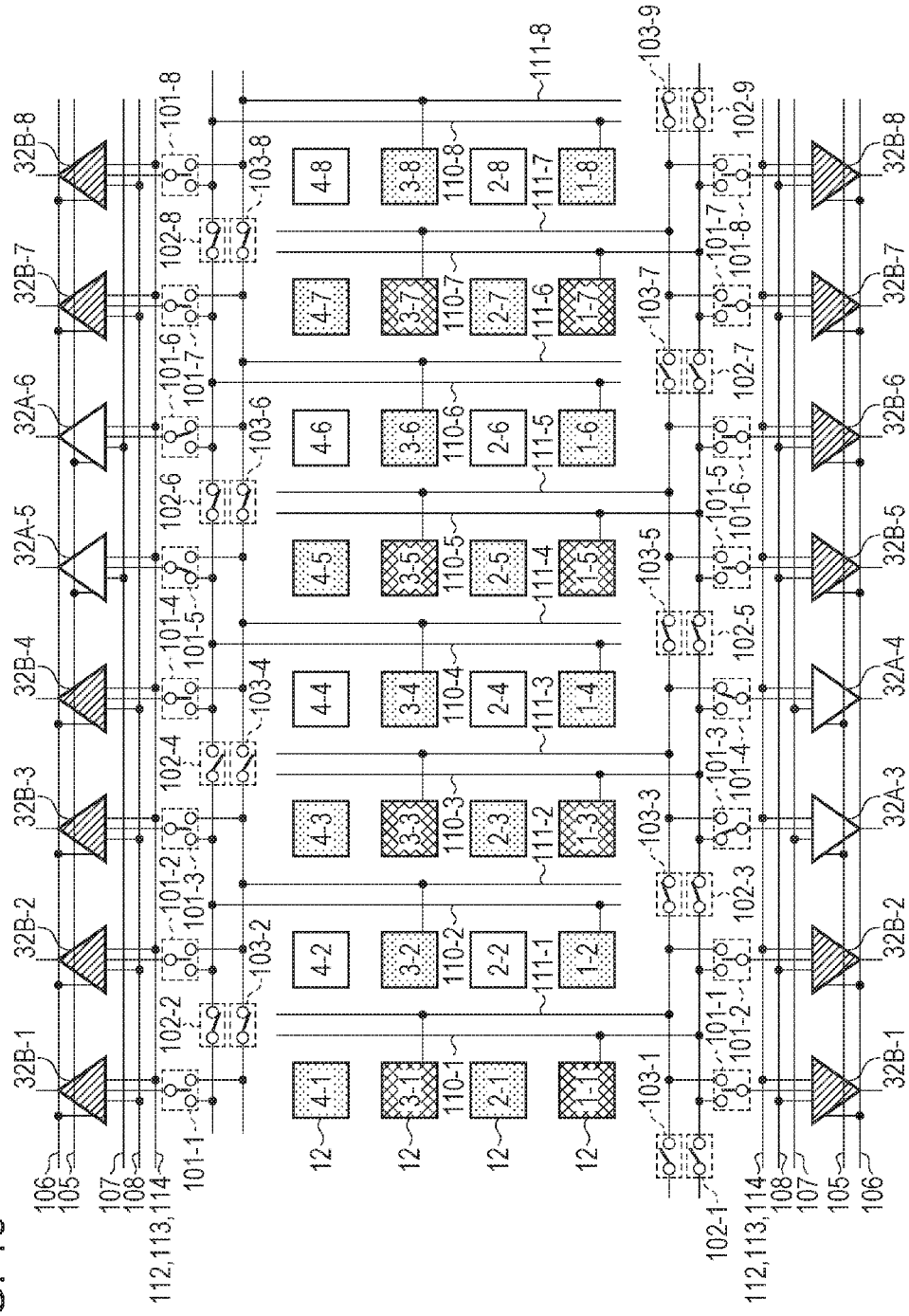
FIG. 15 is a circuit diagram (second one) illustrating a method of driving the solid-state image pickup apparatus according to the fourth embodiment.

A solid-state image pickup apparatus and a method of driving it according to a fourth embodiment are described below with reference to FIG. 13 to FIG. 15. In FIG. 13 to FIG. 15, elements similar to those of the solid-state image pickup apparatus according to one of the first to third embodiments shown in FIG. 1 to FIG. 12 are denoted by similar reference symbols/numerals, and a further description thereof is omitted or simplified. FIG. 13 is a block diagram illustrating an example of a configuration of a solid-state image pickup apparatus according to the third embodiment. FIG. 14 to FIG. 15 are circuit diagrams illustrating a method of driving the solid-state image pickup apparatus according to the present embodiment.

First, a structure of the solid-state image pickup apparatus according to the present embodiment is described below with reference to FIG. 13. The solid-state image pickup apparatus according to the present embodiment is similar to the solid-state image pickup apparatus according to the third embodiment in that pixels 12 in each column of the pixel array 10 are divided into two groups and the two groups are connected to different vertical signal lines. However, the solid-state image pickup apparatus according to the present embodiment is different from the solid-state image pickup apparatus according to the third embodiment in that the column reading circuit 30 includes as many column signal processing circuits 32 as there are vertical signal lines.

In the following description, it is assumed by way of example that pixels 12 are arranged in an array including four rows and eight columns. As shown in FIG. 13, two vertical signal lines 110 and 111 are disposed in each of the eight columns, and thus a total of sixteen vertical signal lines 110 and 111 are disposed. The column reading circuits 30A and 30B each includes eight column signal processing circuits 32A and eight column signal processing circuits 32B, and thus a total of sixteen column signal processing circuits 32A and 32B are disposed. Although a switching circuit for connecting pixels 12 to the column signal processing circuit 32 is different in configuration from the switching circuit according to one of the first to third embodiments, the basic operation thereof is similar to that of the solid-state image pickup apparatus according to the one of the first to third embodiments.

In FIG. 13, vertical signal lines 110 and 111 in odd-numbered columns are connected to the column reading circuit 30A. On the other hand, vertical signal lines 110 and 111 in even-numbered columns are connected to the column reading circuit 30B. In the present embodiment, it is assumed by way of example that the column reading circuit 30A includes column signal processing circuits 32A at locations corresponding to the 3rd and 4th columns, while column signal processing circuits 32B are disposed at locations corresponding to the other columns. Furthermore, it is also assumed by way of example that the column reading circuit 30B includes column signal processing circuits 32A at locations corresponding to the 5th and 6th columns, while column signal processing circuits 32B are disposed at locations corresponding to the other columns.

One switch 102 is disposed between each two adjacent vertical signal lines 110 connected to the same one of the column reading circuits 30A and 30B, and one switch 103 is disposed between each two adjacent vertical signal lines 111 connected to the same one of the column reading circuits 30A and 30B. For example, a switch 102-3 is disposed between a vertical signal line 110-1 and a vertical signal line 110-3. A switch 103-4 is disposed between a vertical signal line 111-2 and a vertical signal line 111-4. Note that the switches 102 and 103 are switches corresponding to the switch S3 shown in FIG. 3 or FIG. 7.

Two selection switches 101 are disposed between each two nodes one of which is a node between adjacent switches 102 and the other one of which is a node between adjacent switches 103 such that one of these two nodes is selected by the selection switches 101 and connected to the column signal processing circuit 32. For example, the selection switch 101-1 for selecting a node to be connected to the column signal processing circuit 32B-1 and the selection switch 101-2 for selecting a node to be connected to the column signal processing circuit 32B-2 are disposed between two nodes one of which is a node between the switches 102-1 and 102-3 and the other one of which is a node between the switches 103-1 and 103-3. Similarly, the selection switch 101-4 for selecting a node to be connected to the column signal processing circuit 32B-4 and the selection switch 101-5 for selecting a node to be connected to the column signal processing circuit 32A-5 are disposed between two nodes one of which is a node between the switches 102-4 and 102-6 and the other one of which is a node between the switches 103-4 and 103-6.

Next, a method of driving the solid-state image pickup apparatus according to the present embodiment is described below with reference to FIG. 14 and FIG. 15 for a case where pixel signals from respective columns in two rows are output from the corresponding column signal processing circuits 32 and for a case where pixel signals from a plurality of pixels are arithmetically averaged, and a resultant signal is output from part of the column signal processing circuits 32.

First, referring to FIG. 14, the example is described in which pixel signals in each column in two rows are output at a time to corresponding column signal processing circuits 32. FIG. 14 shows a conductive state made in a case where signals are output from pixels 12 in respective columns in the 1st row and pixels 12 in respective columns in the 3rd row. In this case, the selection switch 101 in each odd-numbered column selects a connection to the node between adjacent switches 102, while the selection switch 101 in each even-numbered column selects a connection to the node between adjacent switches 103. In the present driving mode, the switches 102 and 103 are all set to be in the non-conductive state (OFF-state).

By controlling the switching circuit in the above-described manner, it is possible to simultaneously output signals of all pixels 12 in two rows (the 1st and 3rd rows in this specific case) from different column signal processing circuits 32. That is, signals of pixels 12 in the 1st, 3rd, 5th, and 7th columns in the 1st row are respectively output from the column signal processing circuit 32B-1, the column signal processing circuit 32A-3, the column signal processing circuit 32B-5, and the column signal processing circuit 32B-7 of the column reading circuit 30A. Signals of pixels 12 in the 2nd, 4th, 6th, and 8th columns in the 1st row are respectively output from the column signal processing circuit 32B-3, the column signal processing circuit 32A-5, the column signal processing circuit 32B-7, and the column signal processing circuit 32B-9 (not shown in FIG. 14) of the column reading circuit 30B. Signals of pixels 12 in the 1st, 3rd, 5th, and 7th columns in the 3rd row are respectively output from the column signal processing circuit 32B-2, the column signal processing circuit 32A-4, the column signal processing circuit 32B-6, and the column signal processing circuit 32B-8 of the column reading circuit 30A. Signals of pixels 12 in the 2nd, 4th, 6th, and 8th columns in the 3rd row are respectively output from the column signal processing circuit 32B-2, the column signal processing circuit 32B-4, the column signal processing circuit 32A-6, and the column signal processing circuit 32B-8 of the column reading circuit 30B.

In the present driving mode, the column signal processing circuits 32A and 32B are both in the driving state. More specifically, an H-level control signal is supplied to the power saving control signal line 105 connected to the column signal processing circuit 32A, and a voltage VclA is supplied to the clip voltage signal line 107. Furthermore, an H-level control signal, as with the control signal supplied to the power saving control signal line 105, is supplied to the power saving control signal line 106 connected to the column signal processing circuit 32B, and the same voltage as the voltage VclA supplied to the clip voltage signal line 107 is supplied to the clip voltage signal line 108.

Next, an example of a driving operation is described below with reference to FIG. 15 for a case in which pixel signals from a plurality of pixels are arithmetically averaged and a resultant signal is output from part of the column signal processing circuits 32.

FIG. 15 shows a conductive state employed in a case where signals from three pixels 12 are arithmetically averaged and a resultant signal is read out. In the example shown in FIG. 15, signals from pixels 12 in the 1st, 3rd, and 5th columns all in the 1st row are arithmetically averaged, and a resultant signal is output from the column signal processing circuit 32A-3 of the column reading circuit 30A. Signals from pixels 12 in the 1st, 3rd, and 5th columns all in the 3rd row are arithmetically averaged, and a resultant signal is output from the column signal processing circuit 32A-4 of the column reading circuit 30A. Signals from pixels 12 in the 4th, 6th, and 8th columns all in the 1st row are arithmetically averaged, and a resultant signal is output from the column signal processing circuit 32A-5 of the column reading circuit 30B. Signals from pixels 12 in the 4th, 6th, and 8th columns all in the 3rd row are arithmetically averaged, and a resultant signal is output from the column signal processing circuit 32A-6 of the column reading circuit 30B. Note that these signals are read out with the same timing.

More specifically, as shown in FIG. 15, the selection switch 101-3 of the column reading circuit 30A and the selection switch 101-5 of the column reading circuit 30B each select a connection to the node between adjacent switches 102. The selection switch 101-4 of the column reading circuit 30A and the selection switch 101-6 of the column reading circuit 30B each select a connection to the node between adjacent switches 103. The other selection switches 101 are all set to be in the non-conductive state (OFF-state). The switches 102-2, 103-2, 102-3, 103-3, 102-5, 103-5, 102-6, 103-6, 102-8, 103-8, 102-9, and 103-9 are set to be in the conductive state (ON-state). The switches 102-1, 103-1, 102-4, 103-4, 102-7, and 103-7 are set to be in the non-conductive state (OFF-state).

By controlling the switching circuit in the above-described manner, the 1st-row-1st-column pixel 12 is connected to the column signal processing circuit 32A-3 of the column reading circuit 30A via the vertical signal line 110-1, the switch 102-3, and the selection switch 101-3 of the column reading circuit 30A. The pixel 12 in the 1st row in the 3rd column is connected to the column signal processing circuit 32A-3 of the column reading circuit 30A via the vertical signal line 110-3 and the selection switch 101-3 of the column reading circuit 30A. The pixel 12 in the 1st row in the 5th column is connected to the column signal processing circuit 32A-3 of the column reading circuit 30A via the vertical signal line 110-5, the switch 102-5, and the selection switch 101-3 of the column reading circuit 30A. As a result, the output signals from these pixels 12 are arithmetically averaged and input to the column signal processing circuit 32A-3 of the column reading circuit 30A.

The pixel 12 in the 3rd row in the 1st column is connected to the column signal processing circuit 32A-4 of the column reading circuit 30A via the vertical signal line 111-1, the switch 103-3, and the selection switch 101-4 of the column reading circuit 30A. The pixel 12 in the 3rd row in the 3rd column is connected to the column signal processing circuit 32A-4 of the column reading circuit 30A via the vertical signal line 111-3 and the selection switch 101-4 of the column reading circuit 30A. The pixel 12 in the 3rd row in the 5th column is connected to the column signal processing circuit 32A-4 of the column reading circuit 30A via the vertical signal line 111-5, the switch 103-5, and the selection switch 101-4 of the column reading circuit 30A. As a result, the output signals from these pixels 12 are arithmetically averaged and input to the column signal processing circuit 32A-4 of the column reading circuit 30A.

The pixel 12 in the 1st row in the 4th column is connected to the column signal processing circuit 32A-5 of the column reading circuit 30B via the vertical signal line 110-4 and the selection switch 101-5 of the column reading circuit 30B. The pixel 12 in the 1st row in the 6th column is connected to the column signal processing circuit 32A-5 of the column reading circuit 30B via the vertical signal line 110-6, the switch 102-6, and the selection switch 101-5 of the column reading circuit 30B. The pixel 12 in the 1st row in the 8th column is connected to the column signal processing circuit 32A-5 of the column reading circuit 30B via the vertical signal line 110-8, the switches 102-8 and 102-6, and the selection switch 101-5 of the column reading circuit 30B. As a result, the output signals from these pixels 12 are arithmetically averaged and input to the column signal processing circuit 32A-5 of the column reading circuit 30B.

The pixel 12 in the 3rd row in the 4th column is connected to the column signal processing circuit 32A-6 of the column reading circuit 30B via the vertical signal line 111-4, the switch 103-6, and the selection switch 101-6 of the column reading circuit 30B. The pixel 12 in the 3rd row in the 6th column is connected to the column signal processing circuit 32A-6 of the column reading circuit 30B via the vertical signal line 111-6 and the selection switch 101-6 of the column reading circuit 30B. The pixel 12 in the 3rd row in the 8th column is connected to the column signal processing circuit 32A-6 of the column reading circuit 30B via the vertical signal line 111-8, the switch 103-8, and the selection switch 101-6 of the column reading circuit 30B. Therefore, the output signals from these pixels 12 are arithmetically averaged and input to the column signal processing circuit 32A-6 of the column reading circuit 30B.

In the present driving mode, as described above, the column signal processing circuits 32B-1, 32B-2, 32B-5, 32B-6, 32B-7, and 32B-8 of the column reading circuit 30A are not used. Furthermore, the column signal processing circuits 32B-1, 32B-2, 32B-3, 32B-4, 32B-7, and 32B-8 of the column reading circuit 30B are not used. Therefore, the column signal processing circuit 32B is brought into the power saving state. In FIG. 15, for easier visual understanding, blocks of column signal processing circuits 32B in the power saving state are shaded.

The present driving mode may be executed according to the timing chart shown in FIG. 5 or FIG. 6 in a similar manner to the third embodiment.

The operations of the clipping circuits 36A and 36B are similar to those according to the first embodiment to the third embodiment. That is, an H-level power saving control signal PSAVEA is supplied to a power saving control signal line 105 connected to a column signal processing circuit 32A to be set in the driving state. On the other hand, an L-level power saving control signal PSAVEB is supplied to a power saving control signal line 106 connected to a column signal processing circuit 32B to be set in the power saving state. To the clip voltage signal lines 107 and 108, voltages VclA and Vc1B similar to those shown in FIG. 5 or FIG. 6 are supplied. Thus it is possible to read out a signal indicating an arithmetically averaged signals from a plurality of pixels 12 while reducing crosstalk occurring via a clip voltage signal line from a column signal processing circuit 32B in the power saving state.

According to the present embodiment, as described above, it is possible to effectively reduce crosstalk between a column signal processing circuit which is not in the power saving state and a column signal processing circuit which is in the power saving state. This makes it possible to achieve a solid-state image pickup apparatus capable of capturing an image with high image quality.

Fifth Embodiment

Figure 16:
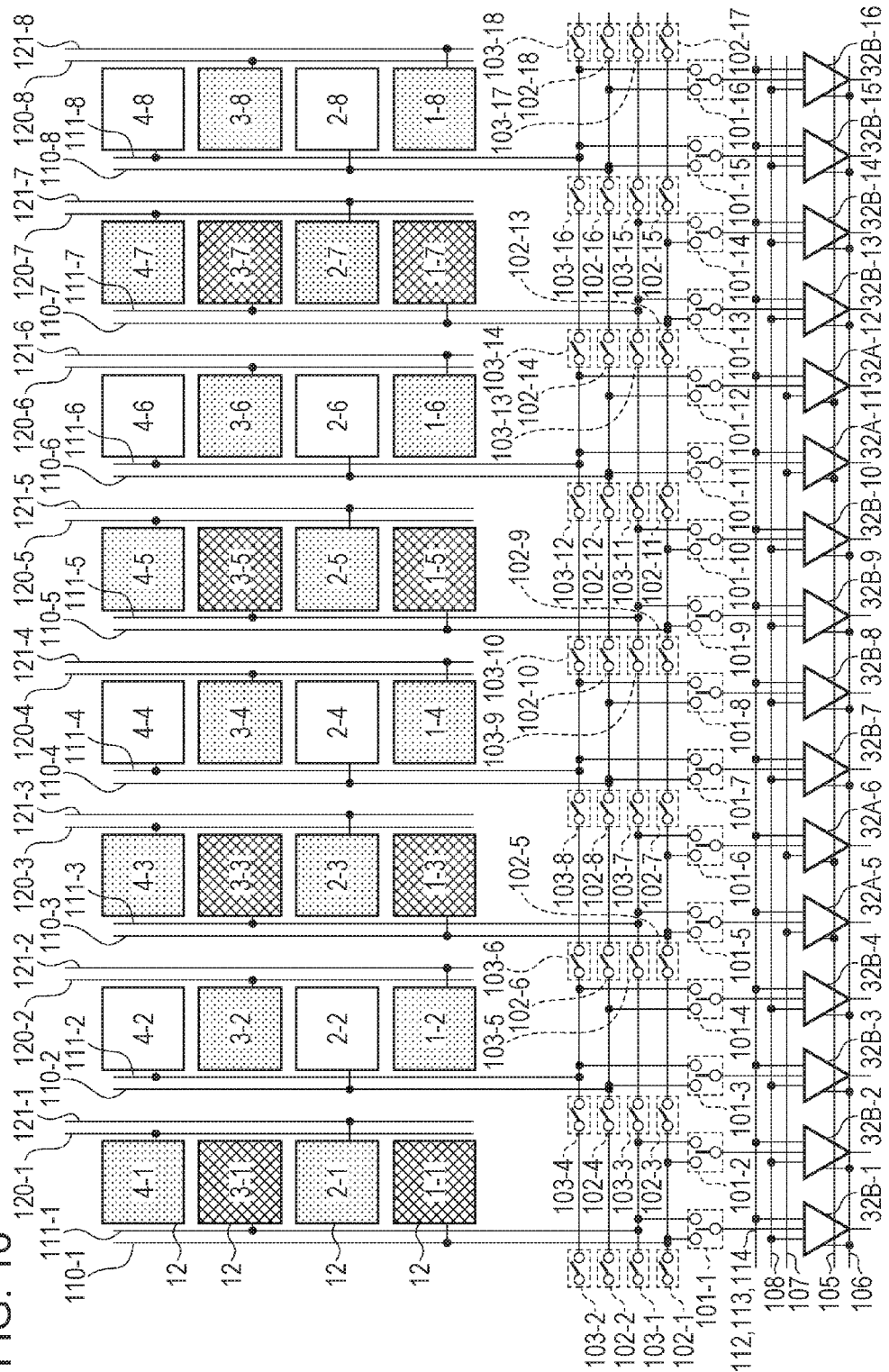
FIG. 16 is a circuit diagram illustrating an example of a configuration of a solid-state image pickup apparatus according to a fifth embodiment.
Figure 17:
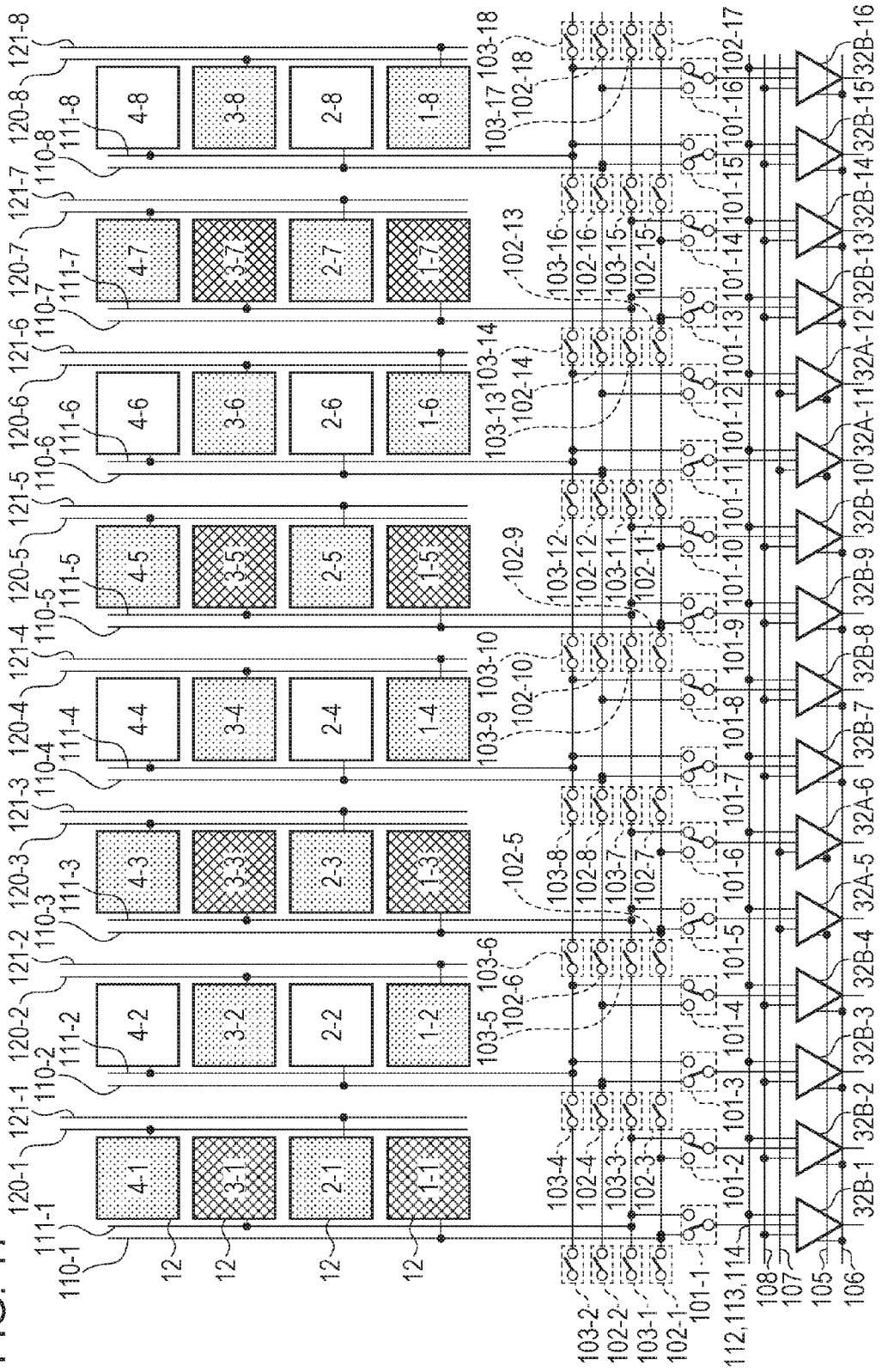
FIG. 17 is a circuit diagram (first one) illustrating a method of driving the solid-state image pickup apparatus according to the fifth embodiment.
Figure 18:
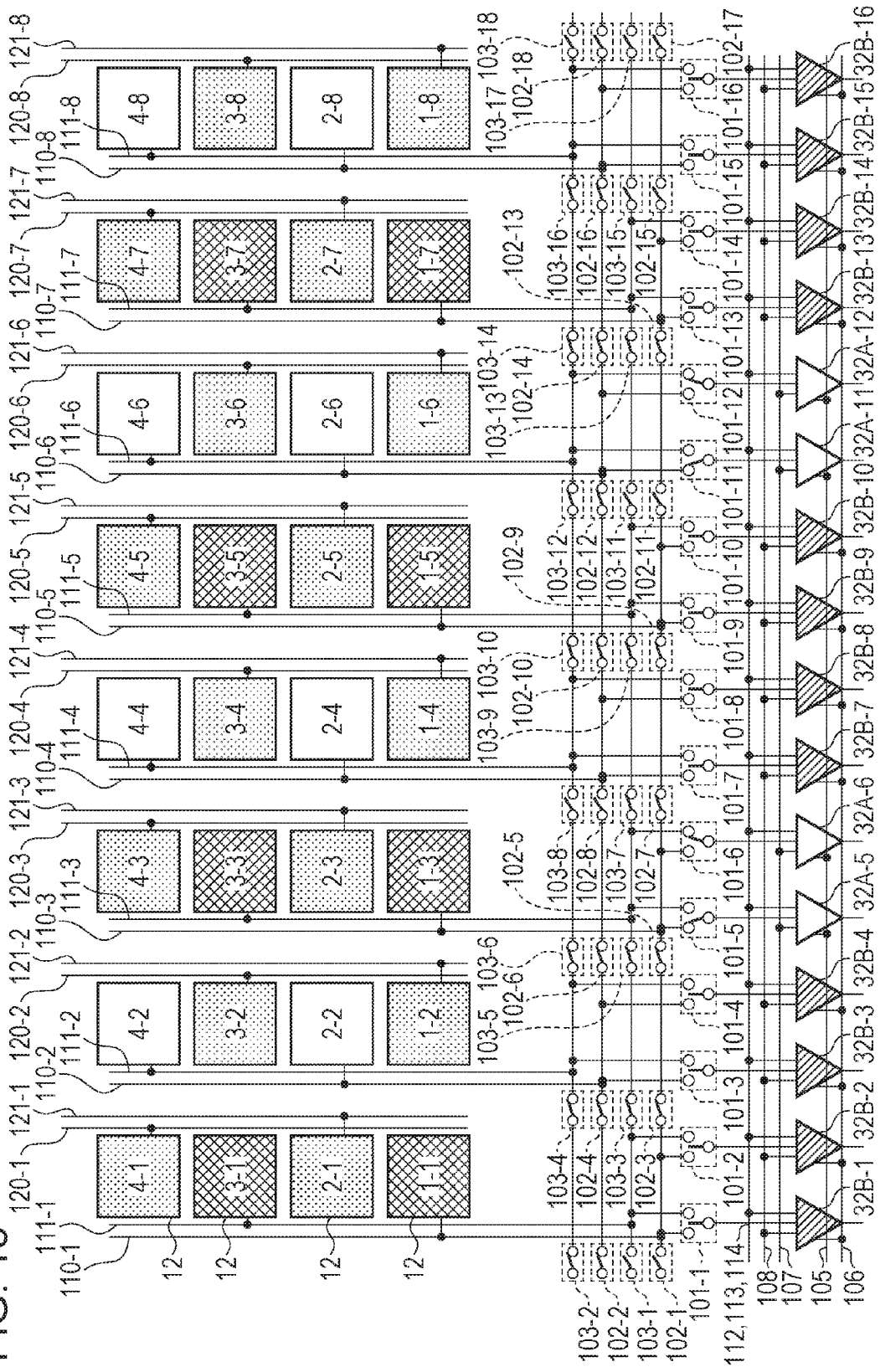
FIG. 18 is a circuit diagram (second one) illustrating a method of driving the solid-state image pickup apparatus according to the fifth embodiment.

A solid-state image pickup apparatus and a method of driving it according to a fifth embodiment are described below with reference to FIG. 16 to FIG. 18. In FIG. 16 to FIG. 18, elements similar to those of the solid-state image pickup apparatus according to one of the first to fourth embodiments shown in FIG. 1 to FIG. 15 are denoted by similar reference symbols/numerals, and a further description thereof is omitted or simplified. FIG. 16 is a block diagram illustrating an example of a configuration of a solid-state image pickup apparatus according to the fifth embodiment. FIG. 17 to FIG. 18 are circuit diagrams illustrating a method of driving the solid-state image pickup apparatus according to the present embodiment.

First, a structure of the solid-state image pickup apparatus according to the present embodiment is described below with reference to FIG. 16. The solid-state image pickup apparatus according to the present embodiment is similar to the solid-state image pickup apparatus according to the fourth embodiment in that pixels 12 in each column of the pixel array 10 are divided into a plurality of groups and these groups are connected to different vertical signal lines. However, the solid-state image pickup apparatus according to the present embodiment is different from the solid-state image pickup apparatus according to the fourth embodiment in that the pixels 12 in each column are divided into four groups.

In the following description, it is assumed by way of example that pixels 12 are arranged in an array including four rows and eight columns. As shown in FIG. 16, four vertical signal lines 110, 111, 120, and 121 are disposed in each of the eight columns, and thus a total of 32 vertical signal lines 110, 111, 120, and 121 are disposed. The column reading circuit 30A includes sixteen column signal processing circuits 32A and 32B. Although not shown in FIG. 16 for simplicity, a column reading circuit 30B (not shown) connected to the vertical signal lines 120 and 121 is also provided. This column reading circuit 30B has a similar circuit configuration to that of the column reading circuit 30A. More specifically, the column reading circuit 30B includes sixteen column signal processing circuits 32A and 32B. Therefore, there are a total of 32 column signal processing circuits 32A and 32B. Although a selection switch for connecting pixels 12 to the column signal processing circuit 32 is different in configuration from the selection switch according to one of the first to fourth embodiments, the basic operation thereof is similar to that of the solid-state image pickup apparatus according to the one of the first to fourth embodiments.

For the vertical signal lines 110 connected to the same column reading circuit 30A or 30B, two switches 102 are disposed in series between each adjacent vertical signal lines 110 in odd-numbered columns and between each adjacent vertical signal lines 111 in even-numbered columns. Similarly, two switches 103 are disposed in series between each adjacent vertical signal lines 120 in odd-numbered columns and between each adjacent vertical signal lines 121 in even-numbered columns.

Two selection switches 101 are disposed between each two nodes one of which is a node between a vertical signal line 110 in an odd-numbered column and a switch 102 and the other one of which is a node between a vertical signal line 111 in an odd-numbered column and a switch 103 such that one of these two nodes is selected by the selection switches 101 and connected to the column signal processing circuit 32. For example, the selection switch 101-1 and the selection switch 101-2 are each disposed between two nodes one of which is a node between the vertical signal line 110-1 and the switch 102-3 and the other one of which is a node between the vertical signal line 111-1 and the switch 103-3. The selection switch 101-1 is a switch for selecting a node to be connected to the column signal processing circuit 32B-1, and the selection switch 101-2 is a switch for selecting a node to be connected to the column signal processing circuit 32B-2.

Two selection switches 101 are disposed between each two nodes one of which is a node between a vertical signal line 110 in an even-numbered column and a switch 102 and the other one of which is a node between a vertical signal line 111 in an even-numbered column and a switch 103 such that one of these two nodes is selected by the selection switches 101 and connected to the column signal processing circuit 32. For example, the selection switch 101-11 and the selection switch 101-12 are each disposed between two nodes one of which is a node between the vertical signal line 110-6 and the switch 102-14 and the other one of which is a node between the vertical signal line 111-6 and the switch 103-14. The selection switch 101-11 is a switch for selecting a node to be connected to the column signal processing circuit 32A-11, and the selection switch 101-12 is a switch for selecting a node to be connected to the column signal processing circuit 32A-12.

Next, a method of driving the solid-state image pickup apparatus according to the present embodiment is described below with reference to FIG. 17 and FIG. 118 In the following description, an example of a driving operation is explained for a case in which pixel signals from a plurality of pixels in each column in four rows are output from a corresponding one of the column signal processing circuits 32 and for a case in which pixel signals of a plurality of pixels are arithmetically averaged and a resultant signal is output from part of the column signal processing circuits 32.

First, referring to FIG. 17, the example is described in which pixel signals in each column in four rows are output at a time to a corresponding one of the column signal processing circuits 32. FIG. 17 illustrates a conductive state employed in a case where signals from pixels 12 in four rows are read out at a time. Note that reading-out signals from pixels 12 connected to the vertical signal line 120 or 121 is performed by the column signal processing circuit 32B (not shown) in a similar manner to the reading-out process performed by the column signal processing circuit 32A described later.

In the present driving mode, two selection switches 101, disposed between each two nodes one of which is a node between a vertical signal line 110 in an odd-numbered column and a switch 102 and the other one of which is a node between a vertical signal line 111 in an odd-numbered column and a switch 103, operate such that these two nodes are connected to different column signal processing circuits 32. Similarly, two selection switches 101, disposed between each two nodes one of which is a node between a vertical signal line 110 in an even-numbered column and a switch 102 and the other one of which is a node between a vertical signal line 111 in an even-numbered column and a switch 103, operate such that these two nodes are connected to different column signal processing circuits 32. The switches 102 and 103 are all set to be in the non-conductive state (OFF-state).

By controlling the switching circuit in the above-described manner, it is possible to simultaneously output signals of all pixels 12 in four rows (the 1st to 4th rows in this specific case) from different column signal processing circuits 32. For example, signals of pixels 12 in the 1st, 3rd, 5th, and 7th columns in the 1st row are respectively output from the column signal processing circuit 32B-1, the column signal processing circuit 32A-5, the column signal processing circuit 32B-9, and the column signal processing circuit 32B-13 of the column reading circuit 30A. Signals of pixels 12 in the 2nd, 4th, 6th, and 8th columns in the 2nd row are respectively output from the column signal processing circuit 32B-3, the column signal processing circuit 32B-7, the column signal processing circuit 32A-11, and the column signal processing circuit 32B-15 of the column reading circuit 30A.

In the present driving mode, the column signal processing circuits 32A and 32B are both in the driving state. More specifically, an H-level control signal is supplied to the power saving control signal line 105 connected to the column signal processing circuit 32A, and a voltage VclA is supplied to the clip voltage signal line 107. Furthermore, an H-level control signal, as with the control signal supplied to the power saving control signal line 105, is supplied to the power saving control signal line 106 connected to the column signal processing circuit 32B, and the same voltage as the voltage VclA supplied to the clip voltage signal line 107 is supplied to the clip voltage signal line 108.

Next, an example of a driving operation is described below with reference to FIG. 18 for a case in which pixel signals from a plurality of pixels are arithmetically averaged and a resultant signal is output from part of the column signal processing circuits 32.

FIG. 18 illustrates a conductive state employed in a case where signals from three pixels 12 are arithmetically averaged and a resultant signal is read out. In the example shown in FIG. 15, signals from pixels 12 in the 1st, 3rd, and 5th columns all in the 1st row are arithmetically averaged and a resultant signal is output from the column signal processing circuit 32A-5 of the column reading circuit 30A. On the other hand, signals from pixels 12 in the 1st, 3rd, and 5th columns all in the 3rd row are arithmetically averaged and a resultant signal is output from the column signal processing circuit 32A-6 of the column reading circuit 30A. Signals from pixels 12 in the 4th, 6th, and 8th columns all in the 2nd row are arithmetically averaged and a resultant signal is output from the column signal processing circuit 32A-11 of the column reading circuit 30A. Signals from pixels 12 in the 4th, 6th, and 8th columns all in the 3rd row are arithmetically averaged and a resultant signal is output from the column signal processing circuit 32A-12 of the column reading circuit 30A. Also in the column reading circuit 30B not shown in the figure, a similar reading-out operation is performed. Note that these signals are read out with the same timing.

More specifically, two selection switches 101 associated with the 3rd and 6th columns of the column reading circuit 30A selects nodes such that one of them selects a node on the side of the vertical signal line 110 and the other one selects a node on the side of the vertical signal line 111. In the example shown in FIG. 18, the selection switches 101 having odd-numbered suffixes (101-5, 101-11) select nodes on the side of the vertical signal line 110, while the selection switches 101 having even-numbered suffixes (101-6, 101-12) select nodes on the side of the vertical signal line 111. The other selection switches 101 are set in the non-conductive state (OFF-state). The switches 102-1, 103-1, 102-8, 103-8, 102-11, 103-11, 102-15, 103-15, 102-17, 103-17, 102-18, and 103-18 are set in the non-conductive state (OFF-state). The other switches 102 and 103 are set in the conductive state (ON-state).

By controlling the switching circuit in the above-described manner, the 1st-row-1st-column pixel 12 is connected to the column signal processing circuit 32A-5 via the vertical signal line 110-1, the switches 102-3 and 102-5, and the selection switch 101-5. The pixel 12 in the 1st row in the 3rd column is connected to the column signal processing circuit 32A-5 via the vertical signal line 110-3 and the selection switch 101-5. The pixel 12 in the 1st row in the 5th column is connected to the column signal processing circuit 32A-5 via the vertical signal line 110-5, the switches 102-9 and 102-7, and the selection switch 101-5. Therefore, the output signals from these pixels 12 are arithmetically averaged and input to the column signal processing circuit 32A-5.

The pixel 12 in the 3rd row ion the 1st column is connected to the column signal processing circuit 32A-6 via the vertical signal line 111-1, the switches 103-3 and 103-5, and the selection switch 101-6. The pixel 12 in the 3rd row in the 3rd column is connected to the column signal processing circuit 32A-6 via the vertical signal line 111-3 and the selection switch 101-6. The pixel 12 in the 3rd row in the 5th column is connected to the column signal processing circuit 32A-6 via the vertical signal line 111-5, the switches 103-9 and 103-7, and the selection switch 101-6. Therefore, the output signals from these pixels 12 are arithmetically averaged and input to the column signal processing circuit 32A-6.

The pixel 12 in the 2nd row in the 4th column is connected to the column signal processing circuit 32A-11 via the vertical signal line 110-4, the switches 102-10 and 102-12, and the selection switch 101-11. The pixel 12 in the 2nd row in the 6th column is connected to the column signal processing circuit 32A-11 via the vertical signal line 110-6 and the selection switch 101-11. The pixel 12 in the 2nd row in the 8th column is connected to the column signal processing circuit 32A-11 via the vertical signal line 110-8, the switches 102-16 and 102-14, and the selection switch 101-11. As a result, the output signals from these pixels 12 are arithmetically averaged and input to the column signal processing circuit 32A-11.

The pixel 12 in the 4th row in the 4th column is connected to the column signal processing circuit 32A-12 via the vertical signal line 111-4, the switches 103-10 and 103-12, and the selection switch 101-12. The pixel 12 in the 4th row in the 6th column is connected to the column signal processing circuit 32A-12 via the vertical signal line 111-6 and the selection switch 101-12. The pixel 12 in the 4th row in the 8th column is connected to the column signal processing circuit 32A-12 via the vertical signal line 111-8, the switches 103-16 and 103-14, and the selection switch 101-12. As a result, the output signals from these pixels 12 are arithmetically averaged and input to the column signal processing circuit 32A-12.

As described above, in the present driving mode, the column signal processing circuits 32B-1, 32B-2, 32B-3, 32B-4, 32B-7, 32B-8, 32B-9, 32B-10, 32B-13, 32B-14, 32B-15, and 32B-16 are not used. Therefore, the column signal processing circuit 32B is brought into the power saving state. In FIG. 18, for easier visual understanding, blocks of column signal processing circuits 32B in the power saving state are shaded.

The present driving mode may be executed according to the timing chart shown in FIG. 5 or FIG. 6 in a similar manner to the third embodiment.

The operations of the clipping circuits 36A and 36B are similar to those according to the first embodiment to the fourth embodiment. That is, an H-level power saving control signal PSAVEA is supplied to a power saving control signal line 105 connected to a column signal processing circuit 32A to be set in the driving state. On the other hand, an L-level power saving control signal PSAVEB is supplied to a power saving control signal line 106 connected to a column signal processing circuit 32B to be set in the power saving state. To the clip voltage signal lines 107 and 108, voltages Vc1A and Vc1B similar to those shown in FIG. 5 or FIG. 6 are supplied. Thus it is possible to read out a signal indicating an arithmetically averaged signals from a plurality of pixels 12 while reducing crosstalk occurring via a clip voltage signal line from a column signal processing circuit 32B in the power saving state.

According to the present embodiment, as described above, it is possible to effectively reduce crosstalk between a column signal processing circuit which is not in the power saving state and a column signal processing circuit which is in the power saving state. This makes it possible to achieve a solid-state image pickup apparatus capable of capturing an image with high image quality.

Sixth Embodiment

An image pickup system according to a sixth embodiment is described below with reference to FIG. 19. In FIG. 19, elements similar to those of the solid-state image pickup apparatus according to one of the first to fifth embodiments shown in FIG. 1 to FIG. 18 are denoted by similar reference symbols/numerals, and a further description thereof is omitted or simplified. FIG. 19 is a block diagram illustrating an example of a configuration of the image pickup system according to the present embodiment.

The solid-state image pickup apparatuses disclosed above in the first to fifth embodiments may be applied to various image pickup systems. Such image pickup systems include, for example, a digital still camera, a digital camcorder, a surveillance camera, and the like. FIG. 19 illustrates an example of a digital still camera to which the solid-state image pickup apparatus according to one of the embodiments is applied.

In the example shown in FIG. 19, the image pickup system 200 includes a solid-state image pickup apparatus 100, a lens 202 for forming an optical image of an object on the solid-state image pickup apparatus 100, an aperture 204 for adjusting an amount of light passing through the lens 202, and a barrier 206 for protecting the lens 202. The lens 202 and the aperture 204 form an optical system for focusing light onto the solid-state image pickup apparatus 100. The solid-state image pickup apparatus 100 is the solid-state image pickup apparatus according to one of the first to fifth embodiments.

The image pickup system 200 also includes an output signal processing unit 208 configured to process an output signal output from the solid-state image pickup apparatus 100. The output signal processing unit 208 performs various kinds of processes such as correction, compression, or the like, as required, and outputs a resultant signal. The output signal processing unit 208 may have a function of performing an analog-to-digital conversion process on the output signal output from the solid-state image pickup apparatus 100. In this case, the column signal processing circuit 32 in the solid-state image pickup apparatus 100 does not necessarily need to include the analog-to-digital converter.

The image pickup system 200 further includes a buffer memory unit 210 for temporarily storing image data, and an external device interface unit (external device I/F unit) 212 for communicating with an external computer or the like. The image pickup system 200 further includes a storage medium 214 such as a semiconductor memory or the like for storing and reading captured image data therein/therefrom, and a storage medium control interface unit (storage medium control I/F unit) 216 for performing an operation of storing and reading in/from the storage medium 214. The storage medium 214 may be disposed inside the image pickup system 200, or the storage medium 214 may be of a removable type.

The image pickup system 200 further includes a general control/operation unit 218 configured to perform various operations and control the whole digital still camera, and a timing generator 220 configured to output various timing signals to the solid-state image pickup apparatus 100 and the output signal processing unit 208. Note that the timing signal or the like may be supplied from the outside, and thus the image pickup system 200 may include at least the solid-state image pickup apparatus 100 and the output signal processing unit 208 configured to process the output signal output from the solid-state image pickup apparatus 100. The general control/operation unit 218 and the timing generator 220 may perform all or part of the functions of the control circuit 60 of the solid-state image pickup apparatus 100.

The solid-state image pickup apparatus 100 outputs an image signal to the output signal processing unit 208. The output signal processing unit 208 performs signal processing on the image signal output from the solid-state image pickup apparatus 100, and outputs a result as image data. Furthermore, the output signal processing unit 208 also generates an image based on the image signal.

In the image pickup system realized using the solid-state image pickup apparatus 100 according to one of the first to fifth embodiments, even in a case where an image is captured in a driving mode in which part of the column signal processing circuits are in the power saving state, it is possible to reduce the influence from the column signal processing circuits in the power saving state. Thus it is possible to realize a low-consumption-power image pickup system capable of capturing a high-quality image.

Modifications to Embodiments

Various modifications to the embodiments described above are possible.

In the examples of the driving modes in which part of the column signal processing circuits are in the power saving state according to one of the embodiments described above, it is assumed by way of example that pixel signals of a plurality of pixels are arithmetically averaged. However, the driving modes in which part of the column signal processing circuits are in the power saving state are not limited to the examples described above. For example, in a case where signals are read out not for all pixels of the pixel array but only part of the pixels, the column signal reading circuit corresponding to pixels that are not read out may be set to be in the power saving state using a driving method similar to that according to one of the first to fifth embodiments.

In another example of a driving mode in which column signal processing circuits are set to be in the power saving state according to the embodiments described above, it is assumed by way of example that a differential amplifier circuit of an amplifier circuit is set to be in the power saving state. However, the circuit according to the present disclosure is not limited to the amplifier circuit. For example, the present disclosure may also be applied to a case where a differential amplifier circuit in a comparator of an analog-to-digital converter is set to be in the power saving state.

In the first embodiment and the second embodiment, pixel signals of two pixels are arithmetically averaged. In the third to fifth embodiments, pixel signals of three pixels are arithmetic ally averaged. However, there is no particular restriction on the number of pixels for which arithmetic averaging is performed.

In the third embodiment and the fourth embodiment, reading out is performed for pixels in two rows at a time. In the fifth embodiment, reading out is performed for pixels in four rows at a time. However, there is no particular restriction on the number of rows for which pixels are read out at a time. The number of the vertical signal lines, the number of column signal reading circuits, and the manner of connecting them may be properly selected depending on the number rows for which pixels are read out at a time.

In the first to fifth embodiments, the arithmetically averaging of pixel signals is performed for pixels in the same row. However, the arithmetically averaging of pixel signals may be performed for pixels in the same column, or the arithmetically averaging of pixel signals may be performed for pixels belonging to a plurality of rows and a plurality of columns.

The circuit configuration of the column signal processing circuit 32 shown in FIG. 3 or FIG. 7 is merely an example. The circuit configuration usable for the column signal processing circuit 32 of the solid-state image pickup apparatus is not limited to those described above. For example, the circuit configuration of the amplifier circuit 34 is not limited to those shown in figures, but various circuit configurations may be employed for the amplifier circuit in the solid-state image pickup apparatus. The column signal processing circuit 32 may further include an analog-to-digital converter, a sample-and-hold circuit, and/or the like.

The circuit configuration of the pixel 12 shown in FIG. 2 is merely an example, and the pixel circuit usable in the solid-state image pickup apparatus according to the present disclosure is not limited to that shown in FIG. 2.

The image pickup system according to the sixth embodiment is merely an example that may be possible using the solid-state image pickup apparatus according to the present disclosure. The configuration of the image pickup system using the solid-state image pickup apparatus according to the present disclosure is not limited to that shown in FIG. 19.

Note that the embodiments described above are given only to show specific examples of implementations of the present disclosure. Note that the technical scope of the present disclosure is not limited by those embodiments. That is, the present disclosure may be embodied in various forms without departing from the technical philosophy or major features of the present disclosure.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-233972 filed Nov. 30, 2015, which is hereby incorporated by reference herein in its entirety.

What is claimed is:

1. A solid-state image pickup apparatus comprising:
a pixel array including a plurality of pixels arranged in a plurality of rows and a plurality of columns; and
a plurality of column signal processing circuits provided respectively for the columns of the pixel array, each being configured to receive output signals from the pixels and an analog signal varying with time,
wherein the plurality of column signal processing circuits include a first column signal processing circuit and a second column signal processing circuit configured such that each of the first column signal processing circuit and the second column signal processing circuit is configured to be independently switched between a driving state and a power saving state, and
a signal line for supplying the analog signal to the first column signal processing circuit and a signal line for supplying the analog signal to the second column signal processing circuit are electrically isolated from each other.

2. The solid-state image pickup apparatus according to claim 1, wherein
each of the plurality of column signal processing circuits includes an amplifier circuit configured to amplify the output signal of the pixel and a clipping circuit configured to clip an output voltage of the amplifier circuit, and
the analog signal input to the column signal processing circuit is a clip voltage supplied to the clipping circuit.

3. The solid-state image pickup apparatus according to claim 1, further comprising:

a first control signal line configured to supply a first control signal for controlling the driving state and the power saving state of the first column signal processing circuit; and a second control signal line different from the first control signal line and configured to supply a second control signal for controlling the driving state and the power saving state of the second column signal processing circuit.

4. The solid-state image pickup apparatus according to claim 1, wherein the plurality of column signal processing circuits includes a plurality of the first column signal processing circuits and a plurality of the second column signal processing circuits, and when the first column signal processing circuits are in the driving state and the second column signal processing circuits are in the power saving state, at least two of the first column signal processing circuits are located adjacent to each other.

5. The solid-state image pickup apparatus according to claim 1, further comprising a switching circuit configured to be capable of switching between a mode in which one of the pixels is connected to each of the column signal processing circuits and a mode in which a plurality of the pixels are connected to one of the column signal processing circuits.

6. The solid-state image pickup apparatus according to claim 1, further comprising a plurality of the signal lines provided for the respective columns, each of the signal lines being connected to the pixels in a corresponding column.

7. The solid-state image pickup apparatus according to claim 6, wherein a plurality of the signal lines are provided for each of the columns, and the number of the columns is equal to the number of the column signal processing circuits.

8. The solid-state image pickup apparatus according to claim 6, wherein a plurality of the signal lines are provided for each of the columns, and the number of signal lines is equal to the number of column signal processing circuits.

9. The solid-state image pickup apparatus according to claim 1, wherein the column signal processing circuits are divided into two groups disposed at locations opposing each other via the pixel array.

10. A solid-state image pickup apparatus comprising:
a pixel array including a plurality of pixels arranged in a plurality of rows and a plurality of columns; and
a plurality of column signal processing circuits provided respectively for the columns of the pixel array, each column signal processing circuit including an amplifier circuit configured to amplify an output signal from at least one of the plurality of pixels and a clipping circuit configured to clip an output voltage of the amplifier circuit, and
a clip voltage signal line for supplying a clip voltage to the clipping circuit of the column signal processing circuits,
wherein the plurality of column signal processing circuits include a first column signal processing circuit and a second column signal processing circuit configured such that each of the first column signal processing circuit and the second column signal processing circuit is configured to be independently switched between a driving state and a power saving state, and the clipping circuit performs a clipping operation on the output voltage only when the column signal processing circuit is in the driving state.

11. The solid-state image pickup apparatus according to claim 10, wherein the clipping circuit performs the clipping operation according to a control signal that controls the driving state and the power saving state of the column signal processing circuit.

12. The solid-state image pickup apparatus according to claim 10, further comprising a first control signal line configured to supply a first control signal that controls the driving state and the power saving state of the first column signal processing circuit; and a second control signal line different from the first control signal line and configured to supply a second control signal that controls the driving state and the power saving state of the second column signal processing circuit.

13. The solid-state image pickup apparatus according to claim 10, wherein the plurality of column signal processing circuits includes a plurality of the first column signal processing circuits and a plurality of the second column signal processing circuit, and when the first column signal processing circuit is in the driving state and the second column signal processing circuit is in the power saving state, at least two of the first column signal processing circuits are located adjacent to each other.

14. The solid-state image pickup apparatus according to claim 10, further comprising a switching circuit configured to be capable of switching between a mode in which one of the pixels is connected to each of the column signal processing circuits and a mode in which a plurality of the pixels are connected to one of the column signal processing circuits.

15. A method of driving a solid-state image pickup apparatus, the solid-state image pickup apparatus including a pixel array including a plurality of pixels arranged in a plurality of rows and a plurality of columns, a plurality of column signal processing circuits provided respectively for the columns of the pixel array, each being configured to receive output signals from the pixels and an analog signal varying with time, the method comprising:

setting a first part of the column signal processing circuits to be in a driving state and setting a second part of the column signal processing circuits to be in a power saving state; and supplying the analog signal to the first part of the column signal processing circuits via a first signal line and supplying the analog signal to the second part of the column signal processing circuits via a second signal line electrically isolated from the first signal line.

16. The method of driving the solid-state image pickup apparatus according to claim 15, wherein each of the plurality of column signal processing circuits includes an amplifier circuit configured to amplify the output signal of the pixel and a clipping circuit configured to clip an output voltage of the amplifier circuit, and the analog signal input to the column signal processing circuit is a clip voltage supplied to the clipping circuit.

17. A method of driving a solid-state image pickup apparatus, the solid-state image pickup apparatus including a pixel array including a plurality of pixels arranged in a plurality of rows and a plurality of columns, and a plurality of column signal processing circuits provided respectively for the columns of the pixel array, each column signal processing circuit including an amplifier circuit configured to amplify an output signal from a pixel and a clipping circuit configured to clip an output voltage of the amplifier circuit, the method comprising:

setting a first part of the column signal processing circuits to be in a driving state and setting a second part of the column signal processing circuits to be in a power saving state; and setting the clipping circuit of the first part of the column signal processing circuits to be in a driving state and setting the clipping circuit of the second part of the column signal processing circuits to be in a non-operating state.

18. An image pickup system comprising the solid-state image pickup apparatus according to claim 1; and a signal processing unit configured to generate an image using the output signal of the pixels output from the solid-state image pickup apparatus.

19. An image pickup system comprising:

the solid-state image pickup apparatus according to claim 10; and a signal processing unit configured to generate an image using the output signal of the pixels output from the solid-state image pickup apparatus.

* * * * *